(12) United States Patent
Menard et al.

(10) Patent No.: US 10,717,267 B2
(45) Date of Patent: *Jul. 21, 2020

(54) PRINTING TRANSFERABLE COMPONENTS USING MICROSTRUCTURED ELASTOMERIC SURFACES WITH PRESSURE MODULATED REVERSIBLE ADHESION

(71) Applicants: X Display Company Technology Limited, Dublin (IE); The Board of Trustees of the University of Illinois, Urbana, IL (US)

(72) Inventors: Etienne Menard, Limoges (FR); John A. Rogers, Champaign, IL (US); Seok Kim, Urbana, IL (US); Andrew Carlson, Urbana, IL (US)

( * ) Notice: Subject to any disclaimer, the term of this patent is extended or adjusted under 35 U.S.C. 154(b) by 130 days.

This patent is subject to a terminal disclaimer.

(21) Appl. No.: 15/195,747

(22) Filed: Jun. 28, 2016

(65) Prior Publication Data
US 2017/0133250 A1 May 11, 2017

Related U.S. Application Data

(62) Division of application No. 13/237,375, filed on Sep. 20, 2011, now Pat. No. 9,412,727.

(51) Int. Cl.
*B41F 16/00* (2006.01)
*H01L 21/683* (2006.01)
(Continued)

(52) U.S. Cl.
CPC ........... *B41F 16/006* (2013.01); *B32B 9/005* (2013.01); *B32B 37/025* (2013.01); *B32B 37/16* (2013.01);
(Continued)

(58) Field of Classification Search
CPC ............... B41F 16/006; B32B 37/025
(Continued)

(56) References Cited

U.S. PATENT DOCUMENTS

| 4,934,267 A | 6/1990 | Hashimoto et al. |
| 5,205,032 A | 4/1993 | Kuroda et al. |

(Continued)

FOREIGN PATENT DOCUMENTS

| EP | 0281100 B1 | 6/1992 |
| JP | H11-142878 A | 5/1999 |

(Continued)

OTHER PUBLICATIONS

Huang et al., Stamp Collapse in Soft Lithography. Langmuir 2005, 21, 8058-8068. (Year: 2005).*

(Continued)

*Primary Examiner* — Atul P. Khare
(74) *Attorney, Agent, or Firm* — William R. Haulbrook; Michael D. Schmitt; Choate, Hall & Stewart LLP

(57) ABSTRACT

In a method of printing a transferable component, a stamp including an elastomeric post having three-dimensional relief features protruding from a surface thereof is pressed against a component on a donor substrate with a first pressure that is sufficient to mechanically deform the relief features and a region of the post between the relief features to contact the component over a first contact area. The stamp is retracted from the donor substrate such that the component is adhered to the stamp. The stamp including the component adhered thereto is pressed against a receiving substrate with a second pressure that is less than the first pressure to contact the component over a second contact area that is smaller than the first contact area. The stamp is then retracted from the receiving substrate to delaminate the component from the stamp and print the component onto the (Continued)

receiving substrate. Related apparatus and stamps are also discussed.

18 Claims, 15 Drawing Sheets

(51) Int. Cl.
    *H01L 23/482*     (2006.01)
    *B81C 1/00*     (2006.01)
    *H01L 25/00*     (2006.01)
    *B32B 37/00*     (2006.01)
    *B32B 41/00*     (2006.01)
    *H01L 21/67*     (2006.01)
    *B32B 9/00*     (2006.01)
    *B32B 37/16*     (2006.01)
    *H01L 21/70*     (2006.01)

(52) U.S. Cl.
    CPC ............. *B32B 41/00* (2013.01); *B41F 16/00* (2013.01); *B81C 1/00373* (2013.01); *H01L 21/67132* (2013.01); *H01L 21/67144* (2013.01); *H01L 21/6835* (2013.01); *H01L 23/4821* (2013.01); *H01L 25/50* (2013.01); *B32B 2313/00* (2013.01); *B32B 2457/14* (2013.01); *H01L 2221/68363* (2013.01); *H01L 2221/68368* (2013.01); *H01L 2221/68381* (2013.01); *H01L 2224/32145* (2013.01); *H01L 2224/83192* (2013.01); *H01L 2224/95001* (2013.01)

(58) Field of Classification Search
    USPC .......................................... 264/293; 156/249
    See application file for complete search history.

(56) References Cited

U.S. PATENT DOCUMENTS

| | | | |
|---|---|---|---|
| 5,550,066 A | 8/1996 | Tang et al. | |
| 5,621,555 A | 4/1997 | Park | |
| 5,815,303 A | 9/1998 | Berlin | |
| 5,882,532 A | 3/1999 | Field et al. | |
| 6,025,730 A | 2/2000 | Akram et al. | |
| 6,180,239 B1 | 1/2001 | Whitesides et al. | |
| 6,278,242 B1 | 8/2001 | Cok et al. | |
| 6,387,778 B1 | 5/2002 | Bonin et al. | |
| 6,555,408 B1 | 4/2003 | Jacobsen et al. | |
| 6,577,367 B2 | 6/2003 | Kim | |
| 6,717,560 B2 | 4/2004 | Cok et al. | |
| 6,756,576 B1 | 6/2004 | McElroy et al. | |
| 6,933,532 B2 | 8/2005 | Arnold et al. | |
| 6,969,624 B2 | 11/2005 | Iwafuchi et al. | |
| 6,974,711 B2 | 12/2005 | Yanagisawa et al. | |
| 6,998,644 B1 | 2/2006 | Boling et al. | |
| 7,127,810 B2 | 10/2006 | Kasuga et al. | |
| 7,129,457 B2 | 10/2006 | McElroy et al. | |
| 7,195,733 B2* | 3/2007 | Rogers .................. | B82Y 10/00 264/496 |
| 7,259,391 B2 | 8/2007 | Liu et al. | |
| 7,288,753 B2 | 10/2007 | Cok | |
| 7,434,512 B2* | 10/2008 | Bietsch ................ | B01J 19/0093 101/368 |
| 7,479,318 B2* | 1/2009 | Jagota ................ | B81C 1/00111 428/88 |
| 7,521,292 B2 | 4/2009 | Rogers et al. | |
| 7,557,367 B2 | 7/2009 | Rogers et al. | |
| 7,586,497 B2 | 9/2009 | Boroson et al. | |
| 7,605,053 B2 | 10/2009 | Couillard et al. | |
| 7,622,367 B1* | 11/2009 | Nuzzo .................. | B82Y 10/00 257/E21.122 |
| 7,662,545 B2 | 2/2010 | Nuzzo et al. | |
| 7,691,656 B2 | 4/2010 | Bader et al. | |
| 7,704,684 B2 | 4/2010 | Rogers et al. | |
| 7,799,699 B2 | 9/2010 | Nuzzo et al. | |
| 7,816,856 B2 | 10/2010 | Cok et al. | |
| 7,893,612 B2 | 2/2011 | Cok | |
| 7,927,976 B2 | 4/2011 | Menard | |
| 7,932,123 B2 | 4/2011 | Rogers et al. | |
| 7,943,491 B2* | 5/2011 | Nuzzo .................. | B82Y 10/00 257/E21.122 |
| 7,972,875 B2 | 7/2011 | Rogers et al. | |
| 7,982,296 B2 | 7/2011 | Nuzzo et al. | |
| 7,999,454 B2 | 8/2011 | Winters et al. | |
| 8,029,139 B2 | 10/2011 | Ellinger et al. | |
| 8,039,847 B2 | 10/2011 | Nuzzo et al. | |
| 8,110,425 B2 | 2/2012 | Yun | |
| 8,142,700 B2* | 3/2012 | Sitti .................... | B29C 33/3842 264/139 |
| 8,198,621 B2 | 6/2012 | Rogers et al. | |
| 8,206,631 B1* | 6/2012 | Sitti ....................... | B29C 39/10 264/255 |
| 8,207,547 B2 | 6/2012 | Lin | |
| 8,217,381 B2* | 7/2012 | Rogers ................ | H01L 21/8258 257/40 |
| 8,261,660 B2 | 9/2012 | Menard | |
| 8,334,545 B2 | 12/2012 | Levermore et al. | |
| 8,394,706 B2 | 3/2013 | Nuzzo et al. | |
| 8,440,546 B2 | 5/2013 | Nuzzo et al. | |
| 8,470,701 B2 | 6/2013 | Rogers et al. | |
| 8,480,942 B2 | 7/2013 | Shannon et al. | |
| 8,502,192 B2 | 8/2013 | Kwak et al. | |
| 8,506,867 B2 | 8/2013 | Menard | |
| 8,524,092 B2* | 9/2013 | Sitti ..................... | A44B 18/0049 216/11 |
| 8,664,699 B2 | 3/2014 | Nuzzo et al. | |
| 8,679,888 B2* | 3/2014 | Rogers ............ | H01L 31/035281 136/261 |
| 8,685,764 B2 | 4/2014 | Chu et al. | |
| 8,686,447 B2 | 4/2014 | Tomoda et al. | |
| 8,703,032 B2* | 4/2014 | Menon ................ | B29C 33/3878 264/227 |
| 8,722,458 B2 | 5/2014 | Rogers et al. | |
| 8,754,396 B2 | 6/2014 | Rogers et al. | |
| 8,766,970 B2 | 7/2014 | Chien et al. | |
| 8,791,474 B1 | 7/2014 | Bibl et al. | |
| 8,794,501 B2 | 8/2014 | Bibl et al. | |
| 8,803,857 B2 | 8/2014 | Cok | |
| 8,817,369 B2 | 8/2014 | Daiku | |
| 8,854,294 B2 | 10/2014 | Sakariya | |
| 8,865,489 B2 | 10/2014 | Rogers et al. | |
| 8,871,547 B2 | 10/2014 | Chu et al. | |
| 8,877,648 B2 | 11/2014 | Bower et al. | |
| 8,889,485 B2 | 11/2014 | Bower | |
| 8,895,406 B2 | 11/2014 | Rogers et al. | |
| 8,934,259 B2 | 1/2015 | Bower et al. | |
| 8,961,855 B2* | 2/2015 | Ho ..................... | B81C 1/00111 216/103 |
| 8,987,765 B2 | 3/2015 | Bibl et al. | |
| 9,132,605 B2* | 9/2015 | Nguyen .................... | C09J 7/00 |
| 9,153,171 B2 | 10/2015 | Sakariya et al. | |
| 9,161,448 B2 | 10/2015 | Menard et al. | |
| 9,238,309 B2 | 1/2016 | King et al. | |
| 9,307,652 B2 | 4/2016 | Bower | |
| 9,358,775 B2 | 6/2016 | Bower et al. | |
| 9,368,683 B1 | 6/2016 | Meitl et al. | |
| 9,401,344 B2 | 7/2016 | Bower et al. | |
| 9,548,332 B2 | 1/2017 | Hu et al. | |
| 9,550,353 B2 | 1/2017 | Bower et al. | |
| 9,555,644 B2 | 1/2017 | Rogers et al. | |
| 9,601,356 B2 | 3/2017 | Bower et al. | |
| 9,626,908 B2 | 4/2017 | Sakariya et al. | |
| 9,640,715 B2 | 5/2017 | Bower et al. | |
| 9,716,082 B2 | 7/2017 | Bower et al. | |
| 9,761,754 B2 | 9/2017 | Bower et al. | |
| 9,765,934 B2 | 9/2017 | Rogers et al. | |
| 9,865,832 B2 | 1/2018 | Bibl et al. | |
| 9,929,053 B2 | 3/2018 | Bower et al. | |
| 10,189,243 B2 | 1/2019 | Menard et al. | |
| 2001/0040298 A1 | 11/2001 | Baba et al. | |
| 2002/0050220 A1 | 5/2002 | Schueller et al. | |

(56) References Cited

U.S. PATENT DOCUMENTS

| | | |
|---|---|---|
| 2002/0158568 A1 | 10/2002 | Satake |
| 2003/0027083 A1 | 2/2003 | Fuller et al. |
| 2003/0141570 A1 | 7/2003 | Chen et al. |
| 2004/0082163 A1 | 4/2004 | Mori et al. |
| 2004/0130020 A1 | 7/2004 | Kuwabara et al. |
| 2004/0173876 A1 | 9/2004 | Musalem et al. |
| 2004/0192041 A1 | 9/2004 | Jeong et al. |
| 2004/0227886 A1 | 11/2004 | Kimura |
| 2005/0040754 A1 | 2/2005 | Sakurai |
| 2005/0133241 A1 | 6/2005 | Chi et al. |
| 2005/0202595 A1 | 9/2005 | Yonehara et al. |
| 2005/0238967 A1 | 10/2005 | Rogers et al. |
| 2005/0285246 A1 | 12/2005 | Haba et al. |
| 2006/0024974 A1 | 2/2006 | Azuri et al. |
| 2006/0038182 A1 | 2/2006 | Rogers et al. |
| 2006/0051900 A1 | 3/2006 | Shizuno |
| 2006/0063309 A1 | 3/2006 | Sugiyama et al. |
| 2007/0032089 A1 | 2/2007 | Nuzzo et al. |
| 2007/0037318 A1 | 2/2007 | Kim |
| 2007/0080464 A1 | 4/2007 | Goebel et al. |
| 2007/0120681 A1 | 5/2007 | Yamazaki et al. |
| 2007/0254455 A1 | 11/2007 | Yamaguchi et al. |
| 2008/0054439 A1 | 3/2008 | Malhan et al. |
| 2008/0108171 A1 | 5/2008 | Rogers et al. |
| 2008/0131822 A1 | 6/2008 | Liao et al. |
| 2008/0164575 A1 | 7/2008 | Ikeda et al. |
| 2008/0185705 A1 | 8/2008 | Osborn et al. |
| 2008/0202365 A1 | 8/2008 | Schneider et al. |
| 2008/0268571 A1 | 10/2008 | Kim |
| 2008/0280085 A1* | 11/2008 | Livne ............... C09J 7/20 428/40.1 |
| 2009/0133914 A1 | 5/2009 | Dellmann et al. |
| 2009/0199960 A1* | 8/2009 | Nuzzo ............... B82Y 10/00 156/230 |
| 2010/0002402 A1* | 1/2010 | Rogers ............ H01L 21/4867 361/749 |
| 2010/0018420 A1* | 1/2010 | Menard ............... B82Y 10/00 101/333 |
| 2010/0021647 A1* | 1/2010 | Sitti ............... B29C 33/3842 427/457 |
| 2010/0062098 A1 | 3/2010 | Ando et al. |
| 2010/0072495 A1 | 3/2010 | Yamazaki |
| 2010/0123134 A1 | 5/2010 | Nagata |
| 2010/0123268 A1* | 5/2010 | Menard ............ H01L 21/6835 264/293 |
| 2010/0155989 A1 | 6/2010 | Ishii et al. |
| 2010/0190293 A1 | 7/2010 | Maeda et al. |
| 2010/0224317 A1 | 9/2010 | Kawamura |
| 2010/0248484 A1 | 9/2010 | Bower et al. |
| 2010/0265440 A1 | 10/2010 | French et al. |
| 2010/0289115 A1 | 11/2010 | Akiyama et al. |
| 2010/0308008 A1 | 12/2010 | Zhu et al. |
| 2010/0316845 A1* | 12/2010 | Rule ............... B29C 61/0608 428/172 |
| 2010/0317132 A1* | 12/2010 | Rogers ............ H01L 25/0753 438/27 |
| 2011/0120754 A1 | 5/2011 | Kondo et al. |
| 2011/0182805 A1 | 7/2011 | DeSimone et al. |
| 2011/0210468 A1* | 9/2011 | Shannon ............... G03F 7/0002 264/139 |
| 2011/0219973 A1 | 9/2011 | Gullentops et al. |
| 2011/0266670 A1 | 11/2011 | England et al. |
| 2011/0277813 A1* | 11/2011 | Rogers ............ H01L 31/035281 136/244 |
| 2012/0000379 A1 | 1/2012 | Greener et al. |
| 2012/0027557 A1 | 2/2012 | Ashdown et al. |
| 2012/0043130 A1 | 2/2012 | Rathburn |
| 2012/0104624 A1 | 5/2012 | Choi et al. |
| 2012/0115262 A1 | 5/2012 | Menard et al. |
| 2012/0126229 A1 | 5/2012 | Bower |
| 2012/0168776 A1 | 7/2012 | Nakamura et al. |
| 2012/0228669 A1 | 9/2012 | Bower et al. |
| 2012/0256346 A1 | 10/2012 | Ogino et al. |
| 2012/0313241 A1 | 12/2012 | Bower |
| 2012/0314388 A1 | 12/2012 | Bower et al. |
| 2012/0321738 A1 | 12/2012 | Ishii et al. |
| 2012/0328728 A1 | 12/2012 | Nakatsuka et al. |
| 2013/0036928 A1 | 2/2013 | Rogers et al. |
| 2013/0068720 A1 | 3/2013 | Taniguchi |
| 2013/0069275 A1 | 3/2013 | Menard et al. |
| 2013/0078576 A1 | 3/2013 | Wu et al. |
| 2013/0088416 A1 | 4/2013 | Smith et al. |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0273695 A1 | 10/2013 | Menard et al. |
| 2013/0333094 A1 | 12/2013 | Rogers et al. |
| 2013/0337608 A1 | 12/2013 | Kotani et al. |
| 2014/0084450 A1 | 3/2014 | Nielson et al. |
| 2014/0094878 A1 | 4/2014 | Gossler et al. |
| 2014/0104243 A1 | 4/2014 | Sakariya et al. |
| 2014/0159064 A1 | 6/2014 | Sakariya et al. |
| 2014/0264763 A1 | 9/2014 | Meitl et al. |
| 2014/0267683 A1 | 9/2014 | Bibl et al. |
| 2014/0327132 A1 | 11/2014 | Zhang et al. |
| 2014/0367633 A1 | 12/2014 | Bibl et al. |
| 2015/0135525 A1 | 5/2015 | Bower |
| 2015/0137153 A1 | 5/2015 | Bibl et al. |
| 2015/0163906 A1 | 6/2015 | Bower et al. |
| 2015/0169011 A1 | 6/2015 | Bibl et al. |
| 2015/0348926 A1 | 12/2015 | Bower |
| 2015/0371874 A1 | 12/2015 | Bower et al. |
| 2016/0016399 A1 | 1/2016 | Bower et al. |
| 2016/0020120 A1 | 1/2016 | Bower et al. |
| 2016/0020127 A1 | 1/2016 | Bower et al. |
| 2016/0020130 A1 | 1/2016 | Bower et al. |
| 2016/0020131 A1 | 1/2016 | Bower et al. |
| 2016/0020187 A1 | 1/2016 | Okada et al. |
| 2017/0047303 A1 | 2/2017 | Meitl et al. |
| 2017/0047306 A1 | 2/2017 | Meitl et al. |
| 2017/0103964 A1 | 4/2017 | Bower et al. |
| 2017/0133248 A1 | 5/2017 | Menard et al. |
| 2017/0154819 A1 | 6/2017 | Bower et al. |
| 2017/0173852 A1 | 6/2017 | Moore et al. |
| 2017/0206845 A1 | 7/2017 | Sakariya et al. |
| 2017/0207193 A1 | 7/2017 | Bower et al. |
| 2017/0256521 A1 | 9/2017 | Cok et al. |
| 2018/0001614 A1 | 1/2018 | Bower et al. |

FOREIGN PATENT DOCUMENTS

| | | |
|---|---|---|
| JP | 2005 099410 A | 4/2005 |
| TW | 200707688 A | 2/2007 |
| WO | WO-2005/088704 A1 | 9/2005 |
| WO | WO-2007/037106 A1 | 4/2007 |
| WO | WO-2008/103931 A2 | 8/2008 |
| WO | WO-2008/143635 A1 | 11/2008 |
| WO | WO-2011/126726 A1 | 10/2011 |
| WO | WO-2016/012409 A2 | 1/2016 |

OTHER PUBLICATIONS

Huang et al., Mechanism for stamp collapse in soft lithography. Applied Physics Letters 87, 251925 (2005). (Year: 2005).*

Hui et al. Constraints on Microcontact Printing Imposed by Stamp Deformation. Langmuir 2002, 18, 1394-1407. (Year: 2002).*

Schmid et al., Siloxane Polymers for High-Resolution, High-Accuracy Soft Lithography, Macromolecules 2000, 33, 3042-3049. (Year: 2000).*

Bietsch et al., Conformal contact and pattern stability of stamps used for soft lithography, J. Appl. Phys., vol. 88, No. 7, 4310-4318, 2000. (Year: 2000).*

Murphy et al., Enhanced Adhesion by Gecko-Inspired Hierarchical Fibrillar Adhesives, Applied Materials & Interfaces, vol. 1, No. 4, 849-855, 2009. (Year: 2009).*

Bower, C. A. et al., Transfer Printing: An Approach for Massively Parallel Assembly of Microscale Devices, IEE, Electronic Components and Technology Conference, 2008, pp. 1105-1109.

Cok, R. S. et al., 60.3: AMOLED Displays Using Transfer-Printed Integrated Circuits, Society for Information Display, 10:902-904 (2010).

(56) References Cited

OTHER PUBLICATIONS

Foest, R. et al., Kalte Normaldruck-Jetplasmen zur lokalen Oberflächenbehandlung, Vakuum in Forschung and Praxis, 21(6):17-21, (2009).

Hamer et al., 63.2: AMOLED Displays Using Transfer-Printed Integrated Circuits, SID 09 Digest, 40(2):947-950 (2009).

Howlader, M. M. R. et al., Nanobonding Technology Toward Electronic, Fluidic, and Photonic Systems Integration, IEEE, Journal of Selected Topics in Quantum Electronics, 17(3):689-703, (2011).

Kim, S. et al, Microstructural elastomeric surfaces with reversible adhesion and examples of their use in deterministic assembly by transfer printing, PNAS, 107(40):17095-17100 (2010).

Roscher, H., VCSEL Arrays with Redundant Pixel Designs for 10Gbits/s 2-D Space-Parallel MMF Transmission, Annual Report, optoelectronics Department, (2005).

Yaniv et al., A 640 x 480 Pixel Computer Display Using Pin Diodes with Device Redundancy, 1988 International Display Research Conference, IEEE, CH-2678-1/88:152-154 (1988).

Arzt, Eduard et al., "From Micro to Nano Contacts in Biological Attachment Devices", *Proceedings of the National Academy of Sciences of the United States of America*, vol. 100, No. 19, Sep. 16, 2003, pp. 10603-10606.

Chaudhury, Manoj K. et al., "Direct Measurement of Interfacial Interactions between Semispherical Lenses and Flat Sheets of Poly(dimethylsiloxane) and Their Chemical Derivatives", *Langmuir*, 1991, vol. 7, No. 5, pp. 1013-1025.

Fan, Zhiyong et al., "Large-Scale, Heterogeneous Integration of Nanowire Arrays for Image Sensor Circuitry", *Proceedings of the National Academy of Sciences of the United States of America*, vol. 105, No. 32 (Aug. 12, 2008), pp. 11066-11070.

Feng, Xue et al., "Competing Fracture in Kinetically Controlled Transfer Printing", *Langmuir*, 2007, vol. 23, No. 25, 2007, pp. 12555-12560.

Geim, AK et al., "Microfabricated adhesive mimicking gecko foot-hair", *Nature Materials*, vol. 2, Jul. 2003.

Gent, A.N., "Adhesion and Strength of Viscoelastic Solids. Is There a Relationship between Adhesion and Bulk Properties?" *Langmuir*, vol. 12, No. 19, 1996, pp. 4492-4496.

Huang, Yonggang Y. et al., "Stamp Collapse in Soft Lithography", *Langmuir*, 2005, vol. 21, No. 17, pp. 8058-8068.

Kim, Dae-Hyeong et al., "Optimized Structural Designs for Stretchable Silicon Integrated Circuits", *Small*, 2009, 5, No. 24, 2841-2847.

Kim, Dae-Hyeong et al., "Stretchable and Foldable Silicon Integrated Circuits", *Science*, vol. 320, Apr. 25, 2008, pp. 507-511.

Kim, Seok et al., "Microstructured elastomeric surfaces with reversible adhesion and examples of their use in deterministic assembly by transfer printing", *PNAS*, Oct. 5, 2010, vol. 107, No. 40, pp. 17095-17100.

Kim, Seok et al., "Reversible dry micro-fibrillar adhesives with thermally controllable adhesion", *Soft Matter*, 2009, 5, pp. 3689-3693.

Lees, A.D. et al., "The Organs of Adhesion In The Aphid Megoura Viciae", *J. exp. Biol.* 136, pp. 209-228, (1988).

Maugis D., "Extension of the Johnson-Kendall-Roberts Theory of the Elastic Contact of Spheres to Large Contact Radii", *Langmuir*, 1995, 11, pp. 679-682.

Meitl, Matthew A. et al., "Transfer printing by kinetic control of adhesion to an elastomeric stamp", *Nature Material*, vol. 5, Jan. 2006, pp. 33-38.

Murphy, Michael P. et al, "Gecko-Inspired Directional and Controllable Adhesion", *Small*, 2009, 5, No. 2, pp. 170-175.

Xu, Zhonghua et al., "Broadband measurement of rate-dependent viscoelasticity at nanoscale using scanning probe microscope: Poly(dimethylsiloxane) example", *Applied Physics Letters*, 2008, 93, 133103-1-133103-3.

Yu, Jennifer et al., "Micropatterning metal electrode of organic light emitting devices using rapid polydimethylsiloxane lift-off", *Applied Physics Letters*, 91, pp. 043102-1-043102-3.

Wu-Bavouzet, Fanny, "Effect of surface pattern on adhesive friction of elastomers," Physical Review E 82, 031806, 2010, 9 pages.

Kim, Tae-Ho et al., "Kinetically controlled, adhesives transfer printing using microstructured stamps," Applied Physics Letters 94, 113502, 2009, 3 pages.

Michel, B. et al, "Printing meets lithography: Soft approaches to high-resolution patterning," IBM J. Res. & Dev. vol. 45, No. 5, Sep. 2001,pp. 697-708.

Bower, C. A. et al., Micro-Transfer-Printing: Heterogeneous Integration of Microscale Semiconductor Devises using Elastomer Stamps, IEEE Conference, (2014).

Cok, R. S. et al., Inorganic light-emitting diode displays using micro-transfer printing, Journal of the SID, 25(10):589-609, (2017).

Trindade, A.J. et al., Precision transfer printing of ultra-thin AlInGaN micron-size light-emitting diodes, Crown, pp. 217-218, (2012).

\* cited by examiner

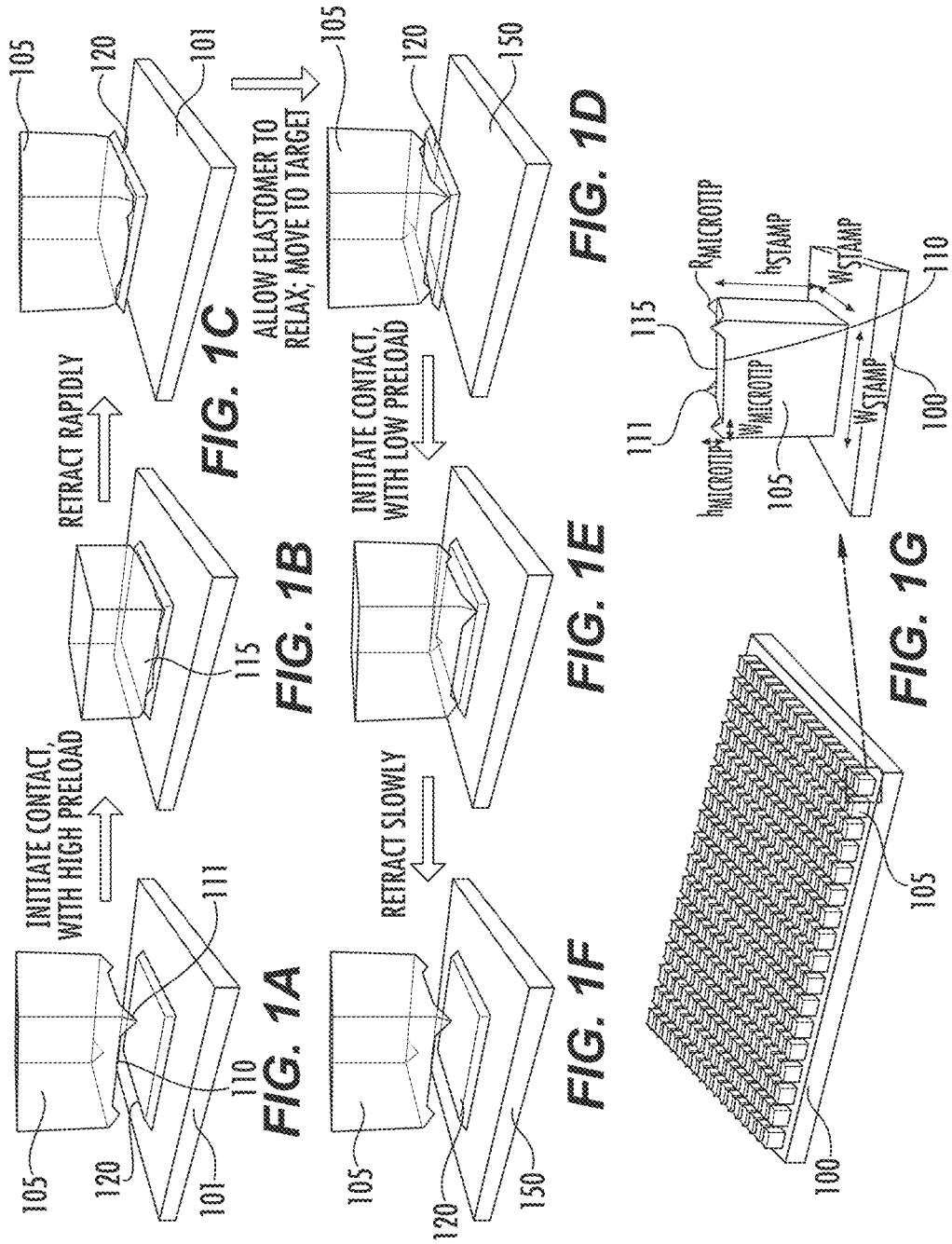

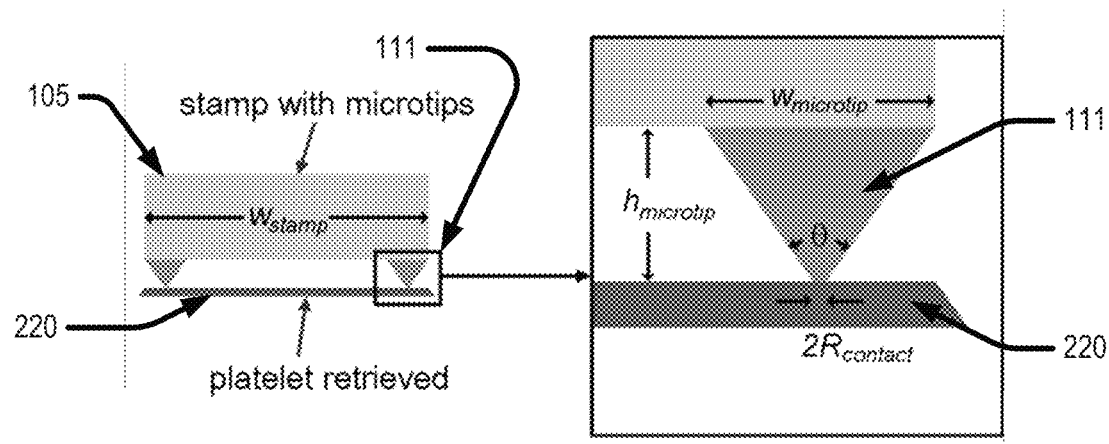
FIG. 2D
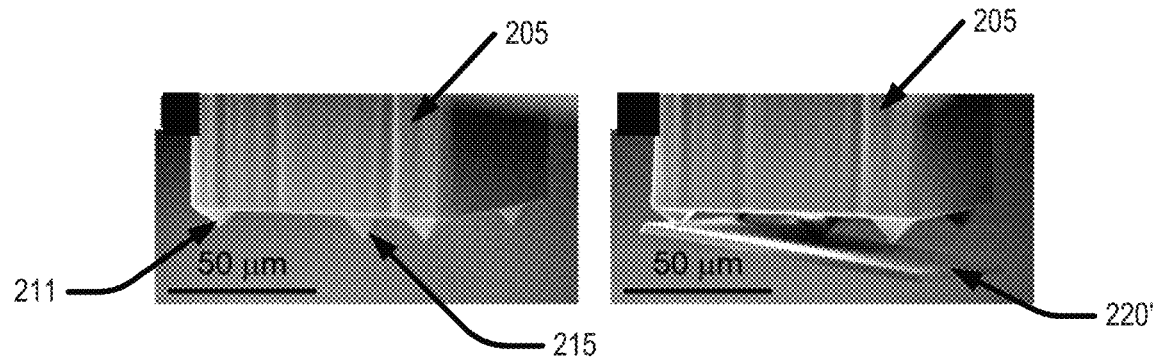
FIG. 2E  FIG. 2F

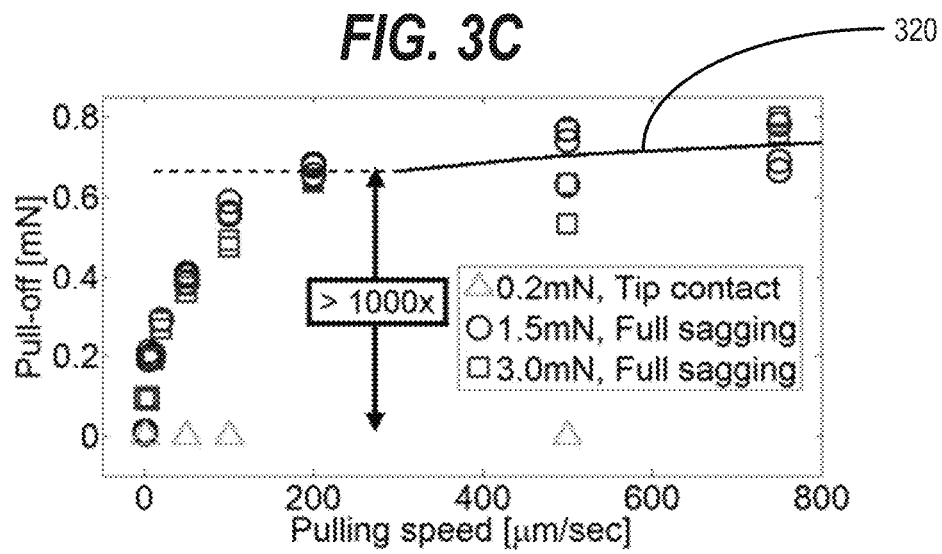
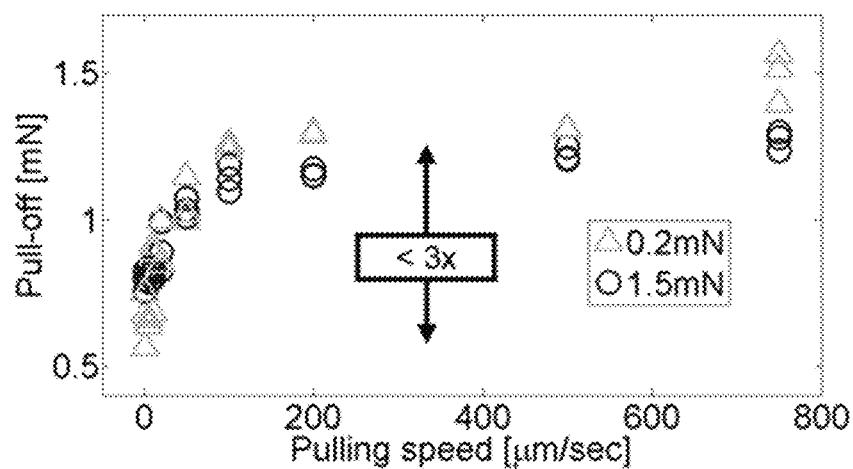

PRINTING TRANSFERABLE COMPONENTS USING MICROSTRUCTURED ELASTOMERIC SURFACES WITH PRESSURE MODULATED REVERSIBLE ADHESION

RELATED APPLICATIONS

This application is a divisional of U.S. patent application Ser. No. 13/237,375 filed Sep. 20, 2011, which is related to U.S. patent application Ser. No. 11/423,192 filed Jun. 9, 2006, and U.S. patent application Publication Ser. No. 12/621,804, filed Nov. 19, 2009, the disclosures of which are specifically incorporated by reference to the extent not inconsistent herewith.

STATEMENT REGARDING FEDERALLY SPONSORED RESEARCH OR DEVELOPMENT

This invention was made with government support under DE-FG02-91ER45439 awarded by the Department of Energy and N00244-09-1-0065 awarded by the Office of Naval Research. The government has certain rights in the invention.

BACKGROUND OF THE INVENTION

Semiconductor chip or die automated assembly equipments typically rely on the use of vacuum operated placement heads often referred to as vacuum grippers or pick-and-place tools. In their simplest embodiment, these placement heads typically consist of an open ended cylinder having a drilled nozzle surface which seals to the die to accomplish physical attachment. Semiconductor chips or die which are ultra thin, fragile, or too small cannot be economically handled by conventional vacuum grippers. As a result, alternative approaches such as self-assembly or dry transfer printing technologies are being investigated.

Transfer printing enables the massively parallel assembly of high performance semiconductor devices onto virtually any substrate material, including glass, plastics, metals or other semiconductors (see, e.g., U.S. patent application Ser. No. 11/145,574 entitled "METHODS AND DEVICES FOR FABRICATING AND ASSEMBLING PRINTABLE SEMICONDUCTOR ELEMENTS," filed Jun. 2, 2005). This semiconductor transfer printing technology relies on the use of a microstructured elastomeric stamp to selectively pick-up devices from a source wafer, and then prints these devices onto a target substrate. The transfer process is massively parallel as the stamps are designed to transfer hundreds to thousands of discrete structures in a single pick-up and print operation.

While pick-and-place tools rely on suction forces, dry transfer printing tools rely on surface adhesion forces to control the pickup and release of the semiconductor devices. To enable dry transfer printing, methods to control the adhesion forces between the semiconductor elements and the elastomeric stamp are required. One such method is described in U.S. patent application Ser. No. 11/423,192 filed Jun. 9, 2006, entitled "PATTERN TRANSFER PRINTING BY KINETIC CONTROL OF ADHESION TO AN ELASTOMERIC STAMP." In that method, the elastomeric stamp adhesion forces are controlled by adjusting the delamination rate of the elastomeric transfer stamp. This control of separation or delamination rate provides a means of increasing the stamp adhesion forces that may be used to pickup semiconductor elements from a source wafer. There may be problems, however, associated with transferring the semiconductor elements from the stamp to a receiving substrate with this technique. For example, stamps optimized for dry transfer printing semiconductor elements with high placement accuracy typically use a stiff backing layer. During the printing or transfer step, the delamination rate of those stamps can be unstable and/or difficult to control when the stiff backing layer(s) are subject to bending forces. Also, printing yields on surfaces that are not ultra smooth, and/or on low tack surfaces, can be very low.

Accordingly, there is a need for improved methods for transfer printing semiconductor elements.

SUMMARY OF THE INVENTION

It should be appreciated that this Summary is provided to introduce a selection of concepts in a simplified form, the concepts being further described below in the Detailed Description. This Summary is not intended to identify key features or essential features of this disclosure, nor is it intended to limit the scope of the disclosure.

Provided are methods and systems for printing transferable components. In methods according to some embodiments of the present invention, a stamp including an elastomeric post having three-dimensional relief features protruding from a surface thereof is pressed against a transferable component on a donor substrate with a first pressure sufficient to mechanically deform a region of the post between the relief features to contact the component over a first contact area. The stamp is retraced from the donor substrate such that the component is adhered to the stamp. The stamp including the component adhered thereto is pressed against a receiving substrate with a second pressure that is less than the first pressure to contact the component over a second contact area that is smaller than the first contact area. The stamp is retracted from the receiving substrate to delaminate the component from the stamp and print the component onto the receiving substrate.

In some embodiments, the second pressure is insufficient to mechanically deform the region of the post between the relief features to contact the component.

In some embodiments, pressing the stamp with the first pressure is sufficient to compress the relief features and collapse the region of the post therebetween to contact the component to define the first contact area. The first contact area may be substantially similar to a cross-sectional area of the post taken along a plane parallel to the surface thereof.

In some embodiments, retracting the stamp from the donor substrate includes removing the first pressure from the stamp to restore the relief features and the region of the post therebetween such that the component is adhered to the stamp by ends of one or more of the relief features to define the second contact area that is smaller than the first contact area.

In some embodiments, an elastic restoring force of the post responsive to removal of the first pressure is insufficient to delaminate the component from the stamp.

In some embodiments, an adhesive strength provided by the first contact area is greater than that of the second contact area by a factor of 1000 or more.

In some embodiments, pressing the stamp with the second pressure is sufficient to compress the relief features without collapse of the region of the post therebetween such that the relief features contact the component over a third contact area that is smaller than the first contact area but is larger than the second contact area.

In some embodiments, retracting the stamp from the donor substrate is performed at a first speed to adhere the component thereto, and retracting the stamp from the receiving substrate is performed at a second speed that is less than the first speed to delaminate the component therefrom. The first speed is sufficient to fracture an interface between the component and the donor substrate without fracturing an interface defined by the first contact area between the stamp and the component. A combination of the first contact area defined by the first pressure, a viscoelastic property of the elastomeric post, and the first speed of retracting may be sufficient to adhere the component to the stamp.

In some embodiments, the first speed may be about 5 micrometers per second or more, and the second speed may be about 1 millimeter per second or less.

In some embodiments, the relief features are positioned around a periphery of the surface of the post.

In some embodiments, the plurality of relief features are first relief features, and the surface of the post further includes a second three-dimensional relief feature that protrudes from the region thereof between the first relief features. The second relief feature may be larger than the first relief features in at least one dimension.

In some embodiments, the elastomeric post and the relief features protruding from the surface thereof comprise polydimethylsiloxane (PDMS). Respective ends of the relief features may have pyramidal, conical, and/or spherical geometries.

An apparatus for printing transferable components according to some embodiments of the present invention includes a stamp, a transfer printing tool head including the stamp mounted thereon, and a controller configured to operate the transfer printing tool head. The stamp includes at least one elastomeric post protruding therefrom, where the post has a surface configured for contact with a respective transferable component and includes three-dimensional relief features protruding therefrom. The controller is configured to operate the transfer printing tool head to contact the stamp including the post protruding therefrom with the respective transferable component on a donor substrate at a first pressure sufficient to mechanically deform a region of the post between the relief features to contact the respective transferable component over a first contact area, retract the stamp from the donor substrate such that the respective transferable component is adhered to the stamp, contact the stamp including the respective transferable component adhered thereto with a receiving substrate at a second pressure that is less than the first pressure to contact the component over a second contact area that is smaller than the first contact area, and retract the stamp from the receiving substrate to delaminate the respective transferable component from the stamp and print the respective transferable component onto the receiving substrate.

In some embodiments, the second pressure is insufficient to mechanically deform the region of the post between the relief features to contact the respective transferable component.

In some embodiments, the first pressure is sufficient to compress the relief features and collapse the region of the post therebetween to contact the respective transferable component over a first contact area. The first contact area may be substantially similar to a cross-sectional area of the post taken along a plane parallel to the surface thereof.

In some embodiments, the controller is configured to operate the transfer printing tool head to remove the first pressure from the stamp during retraction from the donor substrate to uncompress the relief features and uncollapse the region of the post therebetween such that the respective transferable component is adhered to the stamp by ends of one or more of the relief features over a second contact area that is smaller than the first contact area.

In some embodiments, the elastomeric post and the relief features protruding from the surface thereof are formed from polydimethylsiloxane (PDMS), and an adhesive strength provided by the first contact area is greater than that of the second contact area by three or more orders of magnitude.

In some embodiments, the controller is configured to operate the transfer printing tool head to retract the stamp from the donor substrate at a first speed to adhere the respective transferable component thereto, and to retract the stamp from the receiving substrate at a second speed that is less than the first speed to delaminate the respective transferable component therefrom.

In some embodiments, the relief features are positioned around a periphery of the surface of the post. The relief features may be first relief features, and the surface of the post may further include a second three-dimensional relief feature that protrudes from the region thereof between the first relief features. The second relief feature may be larger than the first relief features in at least one dimension.

An elastomeric stamp according to some embodiments of the present invention includes a deformable elastomeric layer having a post protruding therefrom. The post includes an elastomeric surface configured for contact with a transferable component. The surface includes a plurality of three-dimensional relief features protruding therefrom, and one or more of the plurality of relief features is configured to support the transferable component.

In some embodiments, ones of the plurality of relief features are spaced apart from one another on the surface at a distance sufficient such that a region of the surface therebetween is deformable to contact the transferable component responsive to application of a predetermined force to the stamp.

In some embodiments, the predetermined force is sufficient to compress the plurality of relief features and collapse the region of the surface therebetween to contact the transferable component over a first contact area that is substantially similar to a cross-sectional area of the post taken along a plane parallel to the surface thereof. The predetermined force may be about 0.39 mN or more.

In some embodiments, ones of the plurality of relief features are positioned around a periphery of the surface of the post. For example, each of the relief features may be positioned at a respective corner of the post In some embodiments, the plurality of relief features are first relief features, and the surface of the post further includes a second three-dimensional relief feature that protrudes from the region thereof between the first relief features and is configured to support the transferable component. The second relief feature may be larger than the first relief features in at least one dimension.

In some embodiments, a height of each of the plurality of relief features is based on the distance between the ones of the plurality of relief features and an elasticity of the deformable elastomeric layer. For example, the elastomeric layer including the post and the plurality of relief features may be formed of polydimethylsiloxane (PDMS).

In some embodiments, the height of each of the plurality of relief features is between about 8.5 micrometers and about 13 micrometers.

In some embodiments, respective tips of the relief features may have pyramidal, conical, and/or spherical geometries.

Other methods and/or devices according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

Without wishing to be bound by any particular theory, there can be discussion herein of beliefs or understandings of underlying principles or mechanisms relating to embodiments of the invention. It is recognized that embodiments of the invention can nonetheless be operative and useful regardless of the ultimate correctness of any explanation or hypothesis presented herein.

BRIEF DESCRIPTION OF THE DRAWINGS

FIGS. 1A-1F are perspective views of a process flow diagram illustrating methods of printing transferable components according to some embodiments of the present invention.

FIG. 1G provides perspective views illustrating the stamp of FIGS. 1A-1F in greater detail.

FIG. 2D is a cross-sectional schematic illustration of the post structure of FIGS. 1A-1F.

FIGS. 2E and 2F are SEM images showing a post structure having a five-tipped layout according to further embodiments of the present invention.

FIGS. 3C and 3D are graphs illustrating force-speed plots for removing a post having a microtip surface according to some embodiments of the present invention from a silicon wafer as compared to a post having a flat surface.

DETAILED DESCRIPTION OF EMBODIMENTS OF THE INVENTION

Figure 1H:
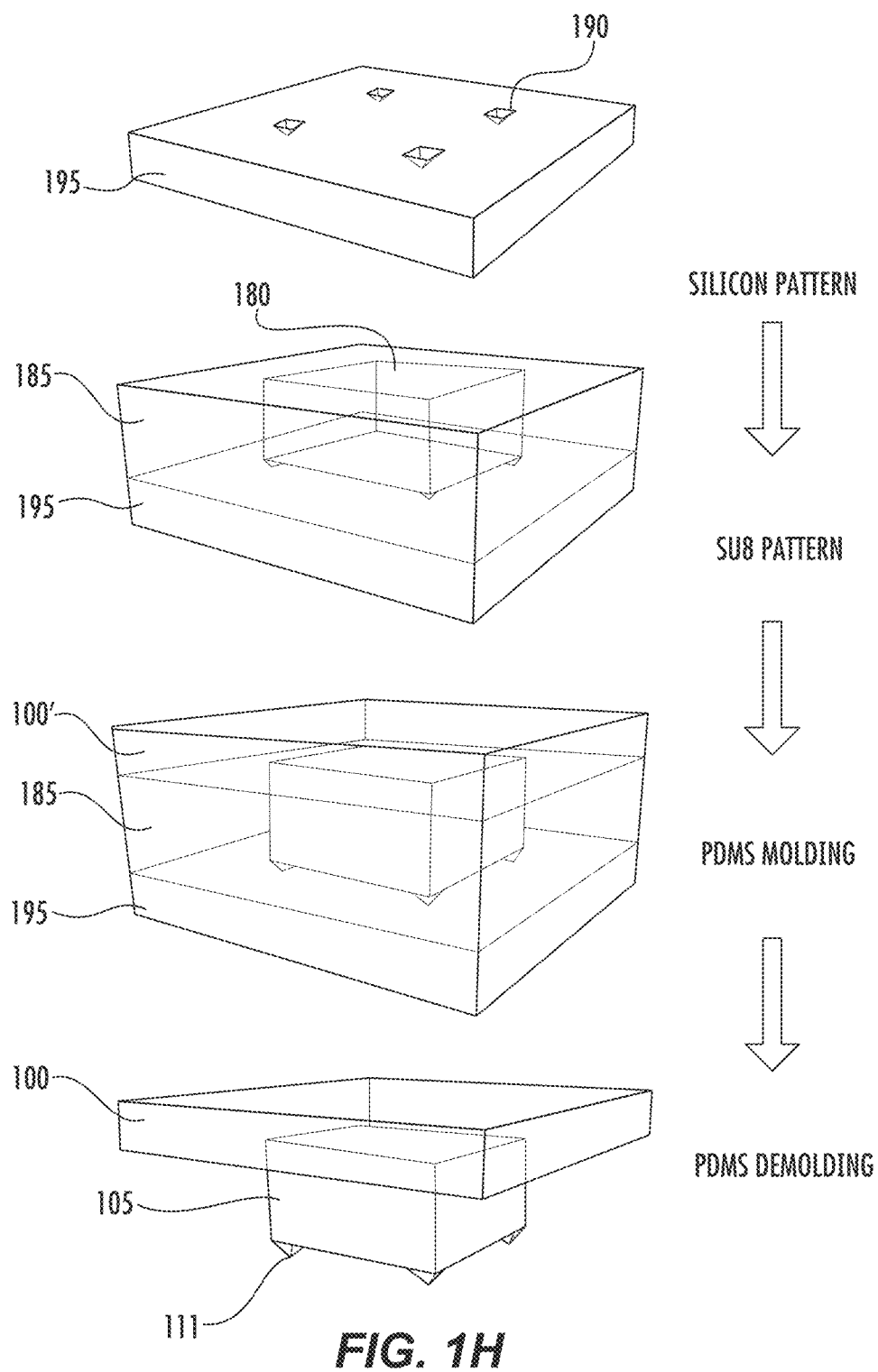
FIG. 1H provides perspective views illustrating operations for the fabricating a stamp including an elastomeric microstructured transfer surface according to some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein. All publications, patent applications, patents, and other references mentioned herein are incorporated by reference in their entireties.

"Printing" refers to a process of transferring a feature, such as a semiconductor component or element, from a first surface to a second surface. In some embodiments, the first surface is a donor surface and the second surface a receiving surface, and the transfer is mediated by an intermediate surface, such as a stamp having a microstructured elastomeric transfer surface, which is capable of releasing the elements to a receiving surface on a target substrate, thereby transferring the semiconductor element. In some embodiments, the printing is dry transfer printing of printable semiconductors, wherein the adhesive force between a solid object and the stamp surface is rate-sensitive.

"Stamp" refers to a component for transfer, assembly and/or integration of structures and materials via printing, for example dry transfer contact printing. Composite stamps, such as composite stamps disclosed in Ser. No. 12/177,963, filed Aug. 29, 2008, hereby incorporated by reference, may be particularly useful for pickup and release/print systems, wherein the stamp can be first laminated or contacted with a donor substrate to pickup microstructures or nanostructures from that donor substrate and subsequently brought into contact with a receiving substrate to which it transfers the microstructures or nanostructures.

"Composite stamp" refers to a stamp having more than one component, such as more than one material. In some embodiments, a composite stamp is made from a deformable layer and a rigid support layer, wherein the deformable and support layers have different chemical compositions and mechanical properties. The deformable layer optionally comprises a composite polymer layer, such as a reinforcement layer having a combination of one or more polymer and a fiber, such as a glass or elastomeric fiber, particulate, such as nanoparticles or microparticles or any combinations thereof.

The deformable layer may be an elastomer layer. "Elastomer" or "elastomeric" refers to a polymeric material which can be stretched or deformed and return to its original shape without substantial permanent deformation. Elastomers commonly undergo substantially elastic deformations. Exemplary elastomers useful in the present invention may comprise, polymers, copolymers, composite materials or mixtures of polymers and copolymers. Elastomeric layer refers to a layer comprising at least one elastomer. Elastomeric layers may also include dopants and other non-elastomeric materials. Elastomers useful in the present invention may include, but are not limited to, silicon containing polymers such as polysiloxanes including poly(dimethyl siloxane) (i.e. PDMS and h-PDMS), poly(methyl siloxane), partially alkylated poly(methyl siloxane), poly (alkyl methyl siloxane) and poly(phenyl methyl siloxane), silicon modified elastomers, thermoplastic elastomers, styrenic materials, olefenic materials, polyolefin, polyurethane thermoplastic elastomers, polyamides, synthetic rubbers, polyisobutylene, poly(styrene-butadiene-styrene), polyurethanes, polychloroprene and silicones.

"Supported" refers to a semiconductor element, such as a micro or nanostructure that will form a semiconductor, that has been adhered to the stamp's surface (e.g., transfer surface), such that the element is capable of being transferred to another surface (e.g., a receiving surface). "Inking" refers to the step of pickup or transfer of micro or nanostructures from a donor substrate to the stamp.

As used herein the expressions "semiconductor component," "semiconductor element," and "semiconductor structure" are used synonymously and broadly refer to a semiconductor material, structure, device and/or component of a device. Semiconductor elements include high quality single crystalline and polycrystalline semiconductors, semiconductor materials fabricated via high temperature processing, doped semiconductor materials, organic and inorganic semiconductors and composite semiconductor materials and structures having one or more additional semiconductor components and/or non-semiconductor components, such as dielectric layers or materials and/or conducting layers or materials. Semiconductor elements include semiconductor devices and device components including, but not limited to, transistors, photovoltaics including solar cells, diodes, light emitting diodes, lasers, p-n junctions, photodiodes, integrated circuits, and sensors. In addition, semiconductor elements refer to a part or portion that forms an end functional semiconductor.

"Relief features" refer to protrusions, extensions or projections on an external surface of respective posts protruding from a stamp, where each post is configured for contact with an individual semiconductor element. The relief features, also referred to herein as a three-dimensional relief pattern, facilitate dry-transfer printing of semiconductor elements from a donor substrate to a target or receiver substrate. "Printable surface area" or "printable surface region" refers to that portion of the stamp used to transfer structures from a donor substrate to a target substrate. A "pattern of relief features" refers to a plurality of features, including a plurality of nanostructures or microstructures, such as an array of features. In some embodiments, one or more relief features may have a different geometry, different dimension(s) such as height, length or width, or may be made from a material resulting in, for example, a different physical parameter such as an effective Young's modulus for that population.

"Lamination" refers to the process of bonding layers of a composite material or a process of producing contact between a first material or layer and a second layer or material (e.g., such as between the rigid backing and reinforcement layer, rigid backing and deformable layer, reinforcement layer and deformable layer, and/or semiconductor element and transfer surface or receiving surface, for example). "Delamination" refers to the stamp transfer surface-semiconductor element separation or the stamp transfer surface-receiving substrate separation. In particular, for embodiments where the stamp has printing posts including protruding relief features that are inked with semiconductor elements, delamination rate refers to separation of the printing post surface including the relief features from the semiconductor elements. Delamination rate may refer to a single post surface delaminating from an individual semiconductor element. Alternatively, delamination rate may refer to a spatially-averaged rate for all post surfaces within the printable surface region. In general, processes provided herein facilitate high transfer yield and placement accuracy for delamination rates that are substantially higher than other techniques.

"Substantially similar" refers to a variable that varies less than about 10% compared to an average value. For example, a substantially similar delamination rate refers to a rate that varies less than 10% from an average rate over the delamination cycle.

"Substrate" refers to a structure or material on which, or in which, a process is conducted, such as patterning, assembly and/or integration of semiconductor elements. Substrates include, but are not limited to: (i) a structure upon which semiconductor elements are fabricated, deposited, transferred or supported; (ii) a device substrate, for example an electronic device substrate; (iii) a donor substrate having elements, such as semiconductor elements, for subsequent transfer, assembly or integration; and (iv) a target substrate for receiving printable structures, such as semiconductor elements.

"Placement accuracy" refers to the ability of a pattern transfer method or device to generate a pattern in a selected region of a substrate. "Good placement" accuracy refers to methods and devices capable of generating patterning in a select region of a substrate with spatial deviations from the absolutely correct orientation less than or equal to 5 microns, particularly for generating patterns of semiconductor elements on target substrates.

"Operably connected" refers to a configuration of layers and/or device components of composite patterning devices of the present invention such that functionality of the components or layers are preserved when connected. Operably connected layers or device components, refers to an arrangement wherein a force applied to a layer or device component is transmitted to another layer or device component. Operably connected layers or device components may be in contact, such as layers having internal and/or external surfaces in physical contact. Alternatively, operably connected layers or device components may be connected by one or more intervening connecting layers, such as thin metal layers or reinforcement layers, positioned between the internal and/or external surfaces of two layers or device components, or that run between two or more layers or components.

The invention may be further understood by the following non-limiting examples.

Embodiments of the present invention are directed to reversible control of adhesion, which is a feature employed in systems such as climbing robots, medical tapes, and stamps for transfer printing. Experimental and theoretical studies of pressure modulated adhesion between flat, stiff objects and elastomeric surfaces with protruding or sharp features of surface relief in improved or optimized geometries are presented herein. In particular embodiments described in greater detail below, the strength of non-specific adhesion can be switched by more than three orders of magnitude, from strong to weak, in a reversible fashion. Implementing these concepts in stamps for transfer printing enables versatile modes for deterministic assembly of solid materials in micro- or nano-structured forms. Examples described below with reference to printed two- and three-dimensional collections of silicon platelets and membranes illustrate some applications of embodiments of the present invention. A type of transistor that incorporates a printed gate electrode, an air gap dielectric, and an aligned array of single walled carbon nanotubes is described below as an example device that may be fabricated in accordance with some embodiments.

Some embodiments of the present invention may arise from observation of modes of adhesion in insects and small animals, such as geckos. In particular, some such creatures exhibit the ability to adhere to a wide variety of surfaces, to rapidly and reversibly change adhesion strength between strong and weak modes, and to self-clean contaminants. Many of these creatures have micro and nanoscale structures with varying levels of complexity on foot or toe-pads. For example, when adhering to or releasing from a smooth surface, aphid adhesion organs (pulvilli) are everted by increased blood pressure or withdrawn by contraction of tibial muscles, respectively. This pressure driven mechanical sagging or retraction of the pulvilli enlarges or diminishes the contacting areas, in a reversible fashion that induces corresponding changes in adhesion strength. Some embodiments of the present invention provide synthetic materials that provide advantages similar to such biological strategies to yield dry adhesives that offer, for example, switchability in adhesion through changes in thermal and/or mechanical conditions, with one area of possible use in methods for deterministic assembly of micro/nanomaterials by transfer printing.

In particular, embodiments of the present invention provide a switchable adhesive surface in which pressure induced sagging of a microstructured or "textured" elastomeric surface provides reversible levels of switchability in non-specific, generalized adhesion. Strong- to weak-adhesion ratios may be higher than 1000 in some embodiments. The designs, which are referred to herein as microtip transfer surfaces, are robust, reusable and can be cleaned with commercial pressure sensitive adhesives like Scotch™ tape. These mechanisms of adhesion are incorporated in stamps for printing-based assembly of silicon nanomembranes and platelets on a variety of surfaces, in two and three dimensional layouts that would be difficult or impossible to accommodate using other methods. As a device example, printing in accordance with embodiments of the present invention is used to form a type of carbon nanotube transistor that uses a nanoscale air gap as a gate dielectric.

The adhesives described herein have potential uses in many applications. In particular, embodiments of the present invention provide advanced capabilities in the manipulation of stiff, solid micro- or nano-scale objects via their selective transfer from one substrate (i.e. donor substrate) to another substrate (i.e. receiver substrate) using soft, elastomeric stamps. This transfer printing process enables massively parallel assembly of diverse materials (i.e. Si, GaN, GaAs, mica, graphene, silica, and others) in various structural forms (i.e. wires, membranes, plates, with dimensions from a few nanometers to macroscopic scales), with throughputs that correspond to millions of objects per hour. A growing number of applications in micro and nanotechnology may benefit from or may be enabled by embodiments of the present invention.

The yields in transfer depend on the ability to switch from strong to weak adhesion for retrieval (i.e. 'inking') and delivery (i.e. 'printing'), respectively. To increase or maximize the versatility, printing is accomplished using stamps without specialized surface chemistries or adhesives. While kinetic approaches that exploit viscoelastic effects in the stamps may be useful, the low contrast in adhesion switching (i.e. approximately 3) may limit their broad utility. The experimental results and associated theoretical models described herein provide alternative design strategies, with enhanced capabilities for printing based assembly, as well as for other areas of use.

FIGS. 1A to 1F illustrate operations and apparatus for transfer printing from a donor substrate 101 to a receiver substrate 150 using a stamp 100 having an elastomeric, microtip adhesive surface in accordance with some embodiments of the present invention. Referring now to FIG. 1A, an elastomeric stamp 100 includes a plurality of posts 105 protruding therefrom. The surface area of the posts 105 define a printable surface area of the stamp 100, and each of the posts 105 is configured to retrieve or ink a transferable component 120. Each post 105 includes an elastomeric microtip transfer surface 110 having a plurality of relief features (or "microtips") 111 protruding therefrom. For example, the geometry may include four features of pyramidal relief 111 on the surface 110 of square posts 105. However, other shapes, such as hemispherical shapes, may be employed for the relief features 111 in some embodiments.

The relief features 111 are positioned in a square array placed on an approximately 1 mm thick backing layer of the same material, configured to allow mechanical deformation or collapse of the region 115 between the relief features 111 of each post 105 when subjected to a sufficient applied pressure or force per unit area. The design illustrated in FIG. 1A allows for high levels of switching in adhesion, involving complex interaction between the pressure-controlled contact area and aspects of soft adhesion that may be inherent in the viscoelastic nature of the elastomer, as discussed in greater detail herein.

FIG. 1B illustrates retrieval (or "inking") of the transferable component 120. As shown in FIG. 1B, during retrieval, the stamp 100 is brought into contact with or pressed against the component 120 with a downward force or pressure that is sufficient to compress the microtips 111 and mechanically deform or collapse the region 115 between the microtips 111 to contact the component 120, thereby increasing or maximizing the contact area (and as a result, the strength of generalized adhesion, which is typically dominated by van der Waals interactions) between the component 120 to be transferred and the stamp 100. To provide sufficiently low strengths of adhesion to the donor substrate 101, the stamp 100 is retracted from the donor substrate 101 at relatively high speeds to retrieve the component 120 in a way that simultaneously increases or maximizes its adhesion to the stamp 100 through viscoelastic effects, as shown in FIG. 1C.

FIG. 1D illustrates that, immediately after retraction, elastic restoring forces bring the region 115 of the post 105 back to its original geometry, such that contact with the component 120 occurs only at the uncompressed or "sharp" points of the microtips 111. Then, as shown in FIG. 1E, the stamp 100, inked in this manner, is brought into contact with or pressed against a receiving surface 150 with a force or pressure that is insufficient to mechanically deform the portion 115 between the microtips 111, such that bottom surface of the component 120 comes into complete contact with the receiving substrate 150, but the region 115 between the microtips 111 of the stamp 100 does not collapse to contact the component 120. The stamp 100 is then retracted from the receiving surface 150 at a relatively low speed to reduce or minimize the adhesion strength associated with viscoelastic effects, thereby facilitating delamination or release of the component 120 from the stamp 100 to complete the transfer printing assembly process, as shown in FIG. 1F.

Precision translation and rotational stages control the positions of the stamp 100 during the various steps in the printing process of FIGS. 1A-1F. After each complete sequence of printing, the resulting structures (e.g., the components 120 on the receiver substrate 150) may be annealed at about 200° C. to 900° C. (depending on the material of the receiver substrate 150) in air for about 3 minutes to reduce or eliminate residual photoresist, and to increase the strength of adhesion.

The microtip surfaces may be formed with the elastomer polydimethylsiloxane (PDMS), using casting and curing procedures of soft lithography with appropriate templates. PDMS is a transparent elastomer having attractive properties such as linear elastic response to elongations of 100% or more, high physical toughness, and excellent fatigue characteristics. FIG. 1G illustrates a PDMS stamp 100 in greater detail. In particular, the stamp 100 includes layer of PDMS including a plurality of elastomeric square posts 105 protruding therefrom. The rightmost area of FIG. 1G shows an enlarged view of a post 105, which includes an elastomeric microtip adhesive surface 110 having four pyramidal microtips 111 arranged in a square array. The dimensions shown in FIG. 1G are discussed in detail in the examples that follow.

As shown in FIG. 1H, the fabrication of the microtips 111 involves casting and curing a layer 100' of the elastomer polydimethylsiloxane (PDMS, 5:1 mixture of base to curing agent) against a Si (100) wafer 195 with a pattern of photolithograpically defined epoxy 185 (100 µm thick). An array of pyramidal pits 190 (15×15 µm squares, 10.6 µm deep, separated by 70 µm with square packing arrangement) is formed in the wafer 195 by anisotropic etching with KOH. The epoxy layer 185 provides square openings 180 (100× 100 µm) with corners aligned to array of pits 190. Casting the prepolymer to PDMS 100' (base oligomer and cross-linking agent) against the functionalized (trichlorosilane) surface of this wafer 195, thermally curing the PDMS 100' (70° C. for >1 hour), and then peeling it back yields the stamp 100 including the elastomeric surfaces with microtips 111.

Figure 1I:
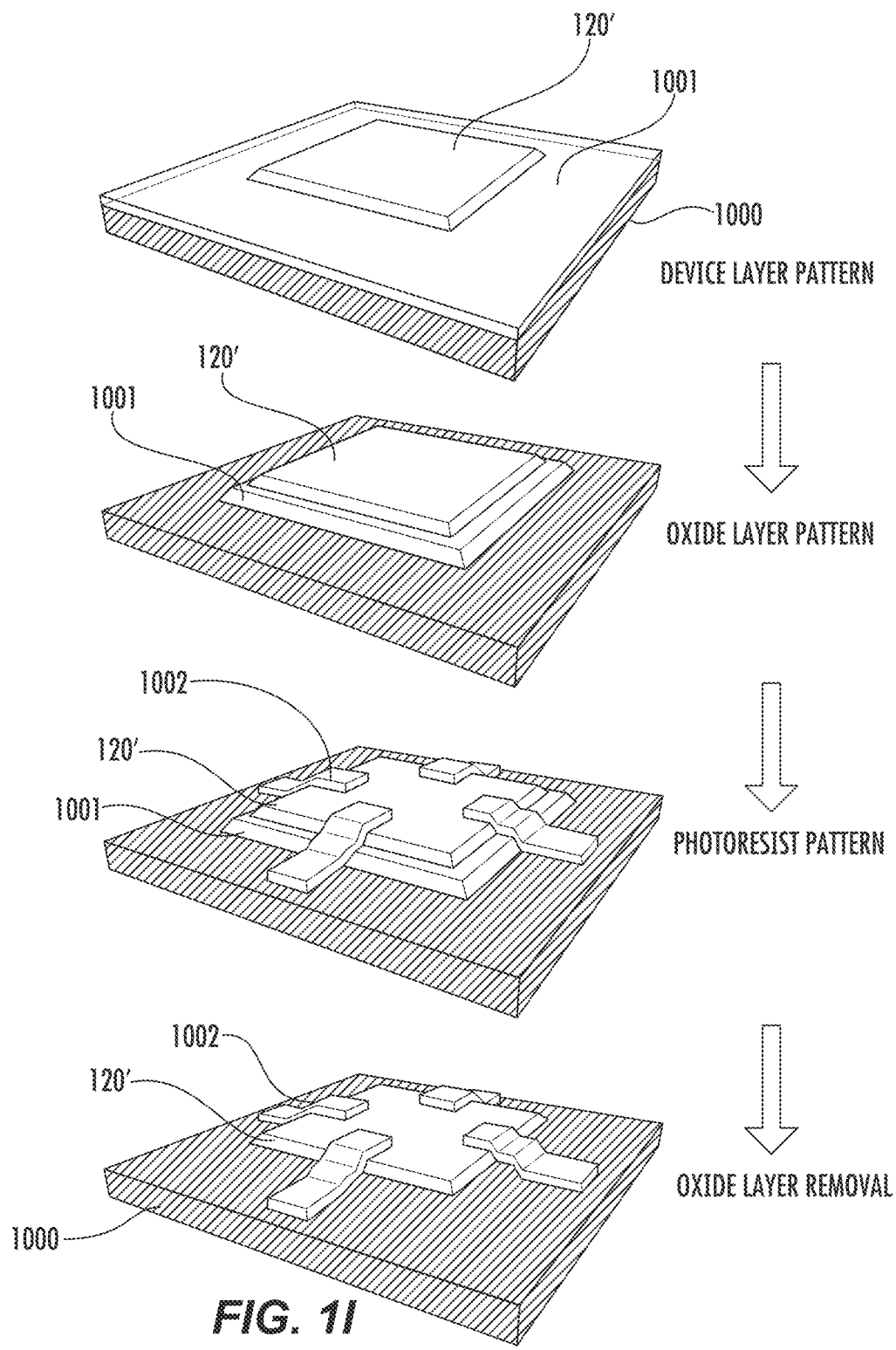
FIG. 1I is a schematic illustration of a process for fabricating silicon platelets in printable configurations by removing a buried oxide layer from a silicon-on-insulator (SOI) wafer according to some embodiments of the present invention.

For purposes of demonstration, transfer printing in accordance with some embodiments may be performed using platelets of silicon (having dimensions of 100×100 µm; thicknesses of 260 nm or 3 µm) as transferable components. FIG. 1I is a schematic illustration of a process for fabricating silicon platelets in printable configurations by removing the buried oxide layer from a silicon-on-insulator (SOI) wafer, starting with SOI wafers 1000 having 3 µm or 260 nm thick top Si layers. In particular, as shown in FIG. 1I, the platelets 120' are defined by patterning a layer of photoresist (1.5 µm thick) in a square geometry (100 µm×100 µm, square packing arrangement, 300 µm separation), and then etching the exposed top Si by $SF_6$ reactive ion etching. Next, wet etching with HF through a mask of photoresist was used to remove the buried oxide 1001 everywhere except for 110× 110 µm squares co-centered with the squares of silicon. A final pattern of photoresist was used to defined mechanical anchor features 1002 (15×45 µm rectangles, 1.5 µm thick) to tether the silicon squares 120' to the underlying wafer 1000 at each of their four sides, and the remaining oxide 1001 was removed by undercut etching with HF.

Figure 2A:
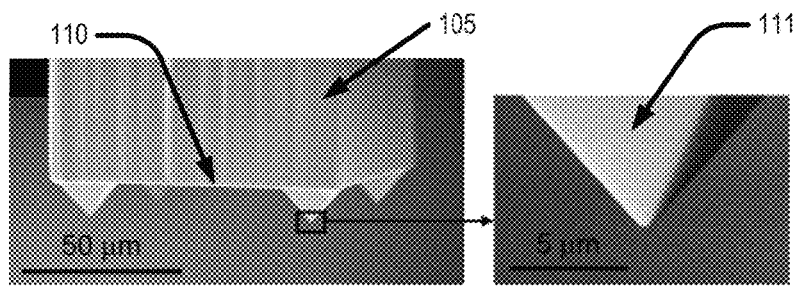
FIGS. 2A-2C are scanning electron microscope (SEM) images of a post structure having a four-tipped layout, as used in the embodiment of FIGS. 1A-1F.
Figure 2B:
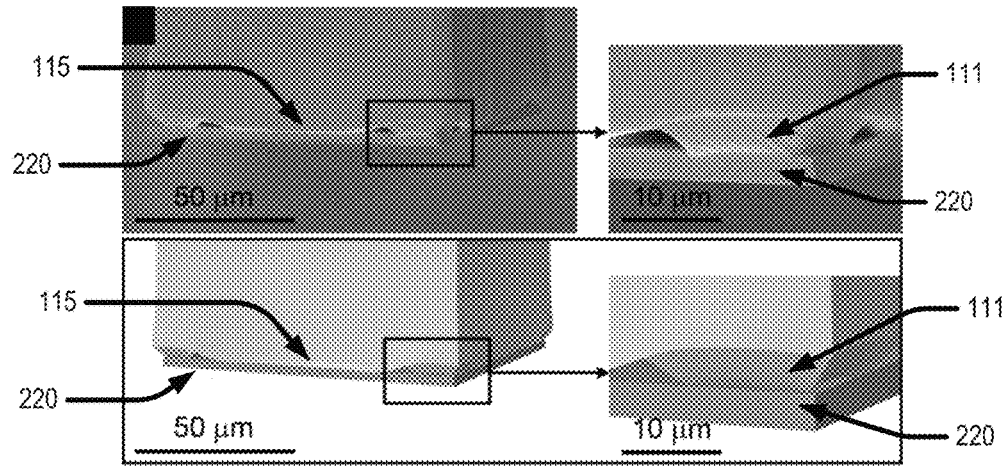
Figure 2C:
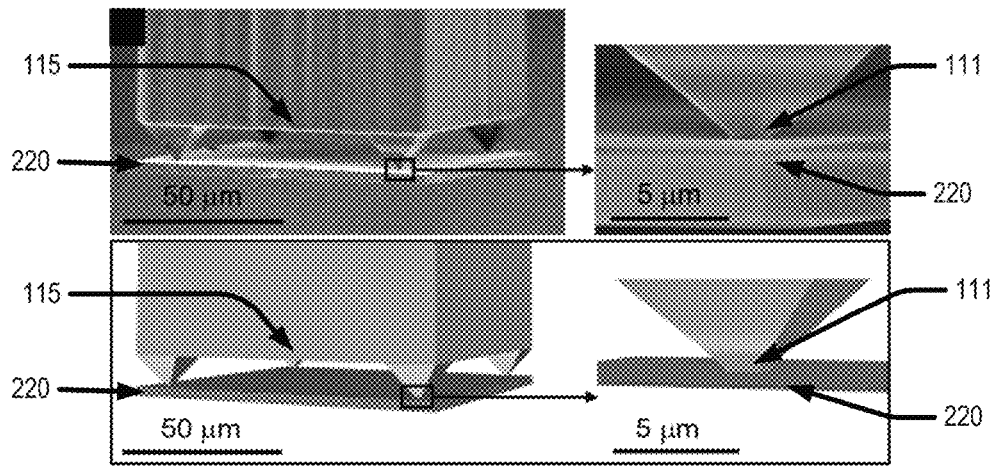

FIGS. 2A-2C are scanning electron microscope (SEM) images of a post structure 105 having a four-tipped layout, as used in the embodiment of FIGS. 1A-1F. In particular, FIG. 2A illustrates an elastomeric post 105 including four microtips 111 on a transfer surface 110, where each microtip 111 is positioned at a corner of the post 105. FIG. 2B illustrates a retrieval or "inking" operation in which the post 105 is brought into contact with or pressed against a transferable silicon component or platelet 220 (3 µm thick; 100 µm×100 µm area). As shown in FIG. 2B, the pressure or force with which the post 105 is pressed against the platelet 220 is sufficient to mechanically deform both the microtips 111 and a central portion 115 of the post between the microtips 111 to contact the platelet 220, thereby increasing the contact area with the platelet 220. FIG. 2C illustrates that, when pressure is no longer applied and the post 105 is retracted, the central portion 115 of the post 105 returns to its original shape due to elastic restoring forces, such that only the sharp points of the microtips 111 remain in contact with the platelet 220. The right frames of FIGS. 2B and 2C provide magnified views of one of the microtips 111 during inking and retraction, respectively, while the lower frames of FIGS. 2B and 2C illustrate the inking and retraction operations, respectively, using finite element modeling.

FIG. 2D is a schematic illustration of the post structure 105 of FIGS. 1A-1F. In particular, FIG. 2D illustrates the width ($w_{stamp}$) of each post 105 and the width ($w_{microtip}$) and height ($h_{microtip}$) of each microtip 111 relative to a retrieved platelet 220. FIG. 2D also illustrates a contact radius ($R_{contact}$) which is a function of the microtip cone angle θ (e.g., the angle between opposing sides of each tip 111) and defines a contact area between each microtip 111 and the retrieved platelet 220. The above stamp dimensions and their relationship to adhesion of the platelet 220 to the post 105 of a stamp 100 is discussed in greater detail below.

FIGS. 2E and 2F are SEM images showing a post structure 205 having a five-tipped layout according to further embodiments of the present invention. In particular, FIG. 2E illustrates a stamp having an elastomeric post 205 including four microtips 211 and a larger microtip 215 on a transfer surface 210. Each microtip 211 is positioned at a corner of the post 205, while the larger microtip 215 is positioned at a central portion of the post 205 between the smaller microtips 211. As shown in FIG. 2F, after retrieving a platelet 220' and retracting the post 205 (including the platelet 220' thereon) from a donor substrate, the central microtip 215 returns to its original shape due to elastic restoring forces, and the tip thereof remains in contact with the platelet 220'. However, one or more of the microtips 211 may no longer be in contact with the platelet 220'. As such, in the embodiments of FIGS. 2E and 2F, the platelet 220' may remain in contact only with the largest, central microtip 215 in the final stages of the transfer printing process.

Figure 2H:
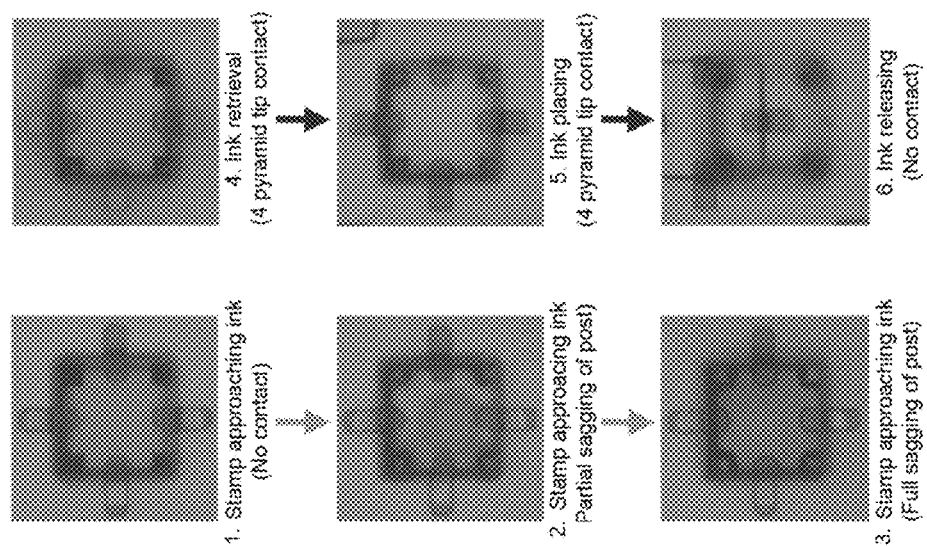
FIGS. 2G and 2H provide side and overhead views of operations and apparatus for transfer printing from a donor substrate to a receiver substrate using the five-tipped stamp of FIGS. 2E-2F.
Figure 2G:
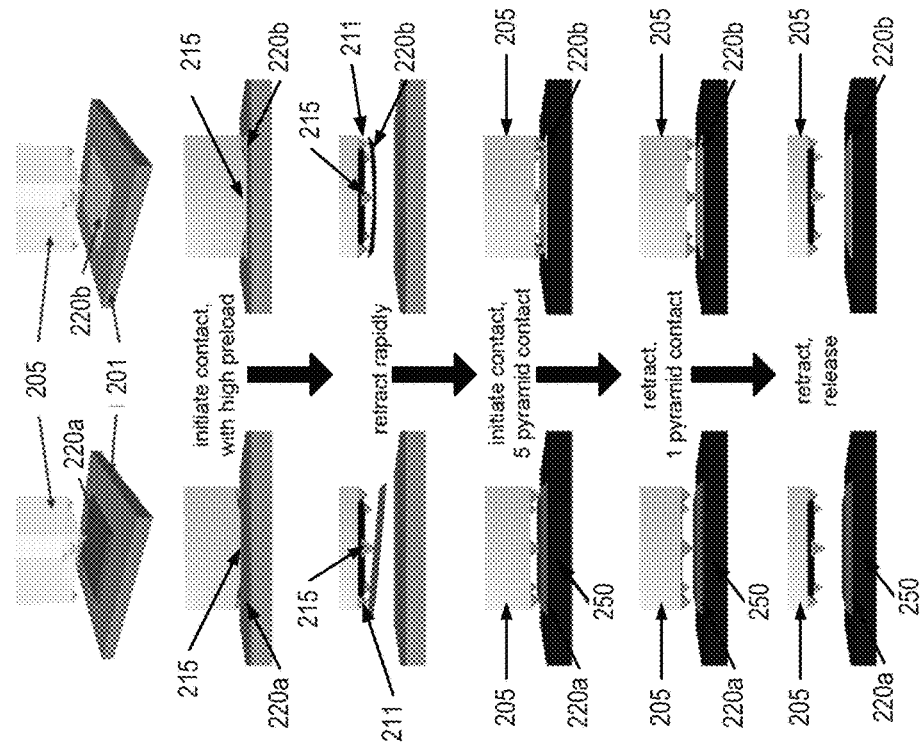

FIGS. 2G and 2H illustrate operations and apparatus for transfer printing from a donor substrate 201 to a receiver substrate 250 using the five-tipped stamp 200 of FIGS. 2E-2F, for a relatively thick component 220a (having a thickness of about 3 μm; shown at left side of FIG. 2G) or a relatively thin component 220b (having a thickness of about 260 nm; shown at right side of FIG. 2G). FIG. 2H illustrates optical microscope top view images of the stamp, which were collected by viewing through a transparent stamp during various stages of the printing. As shown in FIGS. 2G and 2H, the stamp 200 is pressed against the component 220a/220b on the donor substrate 201 with a force sufficient to collapse the central region of the post 205 including the largest microtip 215 to contact the component 220a/220b. The stamp 200 including the component 220a/220b adhered thereto is rapidly retracted from the donor substrate 201. For the relatively thick component 220a, the largest microtip 215, located in the central region of the post 205 between the smaller microtips 211, is the only point of contact between the stamp 200 and the component 220a. However, the relatively thin component 220b may partially deform during the retrieval process, such that all five of the microtips 211 and 215 contact the component 220b. The stamp 200 including the component 220a/220b adhered thereto is then pressed against the receiver substrate 250 with a force that is insufficient to substantially deform the central region of the post 205 including the larger microtip 215 thereon, and is then retracted from the receiver substrate 250 at a relatively slow speed (in comparison to retraction from the donor substrate 201) such that the component 220a/220b is delaminated from the stamp 200 and printed onto the receiver substrate 250.

Figure 3A:
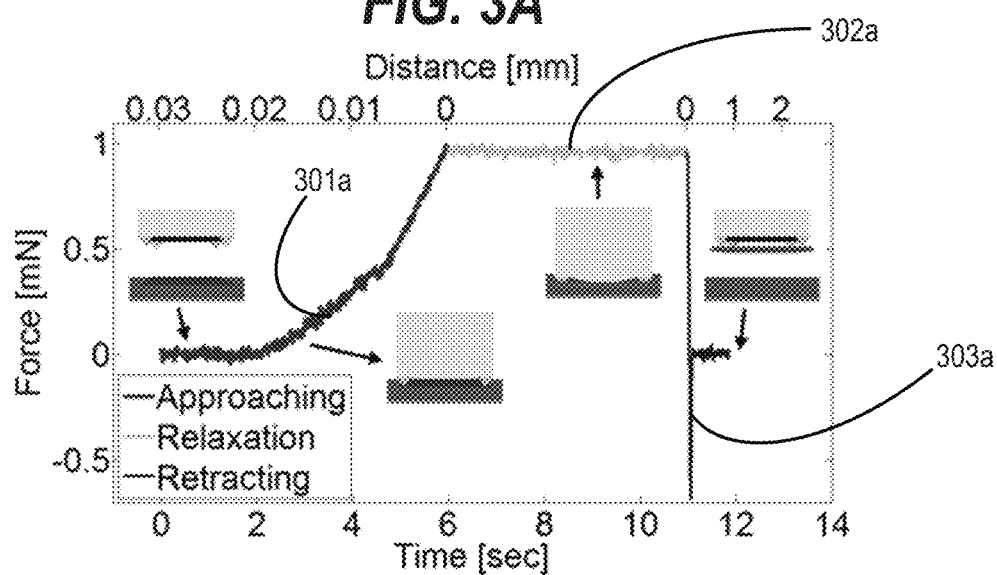
FIGS. 3A and 3B are graphs illustrating force-time and force-distance curves associated with contact of a microtip surface with a silicon wafer in transfer printing operations according to some embodiments of the present invention.
Figure 3B:
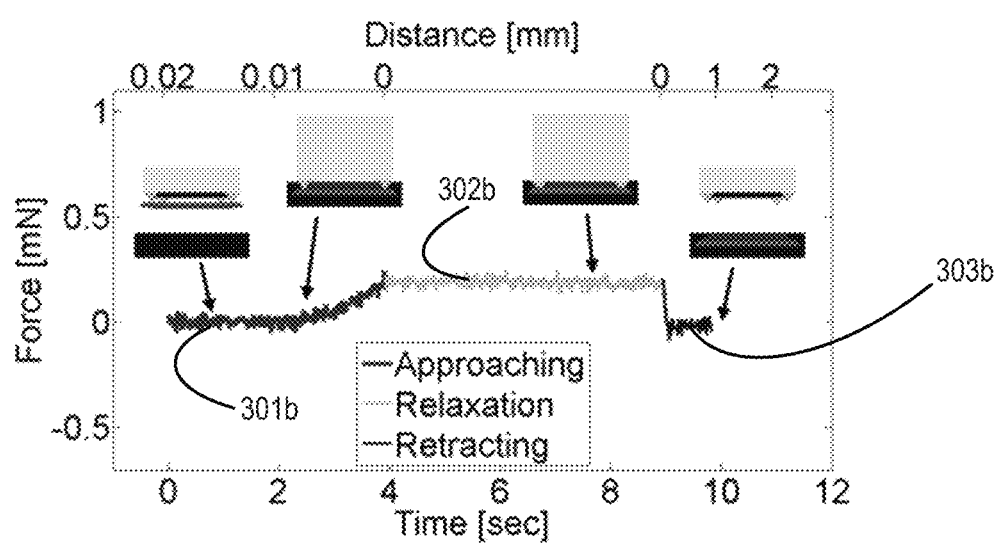

FIGS. 3A and 3B illustrate force-time and force-distance curves associated with contact of a microtip surface with a silicon wafer in transfer printing operations. In particular, the plots of FIGS. 3A and 3B illustrate operation for retrieval and delivery, respectively, for a single post 105 having the four-tipped design (as shown above in FIGS. 1A-1F) collected at an approach speed of 5 λm/s, terminated at a specified load for 5 s, and then retracted at 1 mm/s. In FIGS. 3A and 3B, time is indicated on the bottom axes, and distance indicated on the top axes.

Referring now to FIG. 3A, the maximum tensile force during retraction defines the strength of adhesion (i.e. pull-off). FIG. 3A shows data for a representative case of full mechanical deformation or collapse of the region 115 between the microtips 111 under a preload force of about 1 mN during the retrieval operation, with a retraction speed of about 1 mm/s. Two slopes are evident in the approaching curve 301a, indicating an increase in stiffness when the region 115 between the microtips 111 collapses and contacts the substrate. The slope in the first region defines an effective spring constant associated with compression of the microtips 111, with a minor contribution from deformation of the post 105. The second region includes the elasticity of the post 105 itself, and its elastomeric support. The sharp, negative feature in the curve collected during retraction 303a corresponds to rapid release from the contacting surface, and its magnitude defines the adhesion force (i.e. pull-off).

FIG. 3B summarizes the corresponding cases of approaching 301b, relaxation 302b, and retracting 303b during the delivery operation without collapse of the region 115 between the microtips 111, at a preload force of about 0.2 milliNewtons (mN) and a retraction speed of about 1 mm/s. In FIG. 3B, the adhesion force is too small to measure with the load cell. Images collected with an inverted optical microscope and an SEM (as shown in FIGS. 2B and 2C) suggest effective contact areas in the collapsed and uncollapsed states that correspond to approximately 80% and approximately 0.07%, respectively, of the area of the post 105 and the microtips 111. The ratio of these areas suggests an expected difference in adhesion between the collapsed and uncollapsed states of more than about 1000 times; however, as this estimate does not include viscoelastic effects, it may underestimate the actual difference that can be achieved.

FIGS. 3C and 3D illustrate force-speed plots for removing a post having a microtip surface (FIG. 3C) and a post having a flat surface (FIG. 3D) from the silicon wafer, as a function retraction speed for three different preload cases. The three preload cases with forces of 0.2 mN, 1.5 mN, and 3 mN simulate the steps of retrieval (1.5 mN, 3 mN) and delivery (0.2 mN) in a printing process. Modeling results for the microtip surface are indicated as a line 320 in FIG. 3C. As shown in FIG. 3C, with preload forces of 1.5 mN and 3 mN (both of which are sufficient to induce mechanical collapse or "sagging" of the central region 115 of the post 105), the adhesion force depends strongly on retraction speed. As shown in FIG. 3D, this functional dependence is also evident in data for the corresponding flat surfaces, and arises from the viscoelastic nature of the PDMS. Significant changes in such adhesion behaviors was not observed even on repeated cycling tests. Accordingly, embodiments of the present invention employ these combined geometric and material effects to provide high levels of switching in adhesion, for use in transfer printing, without the need for surface chemistries or separate adhesives to guide transfer.

Figure 3E:
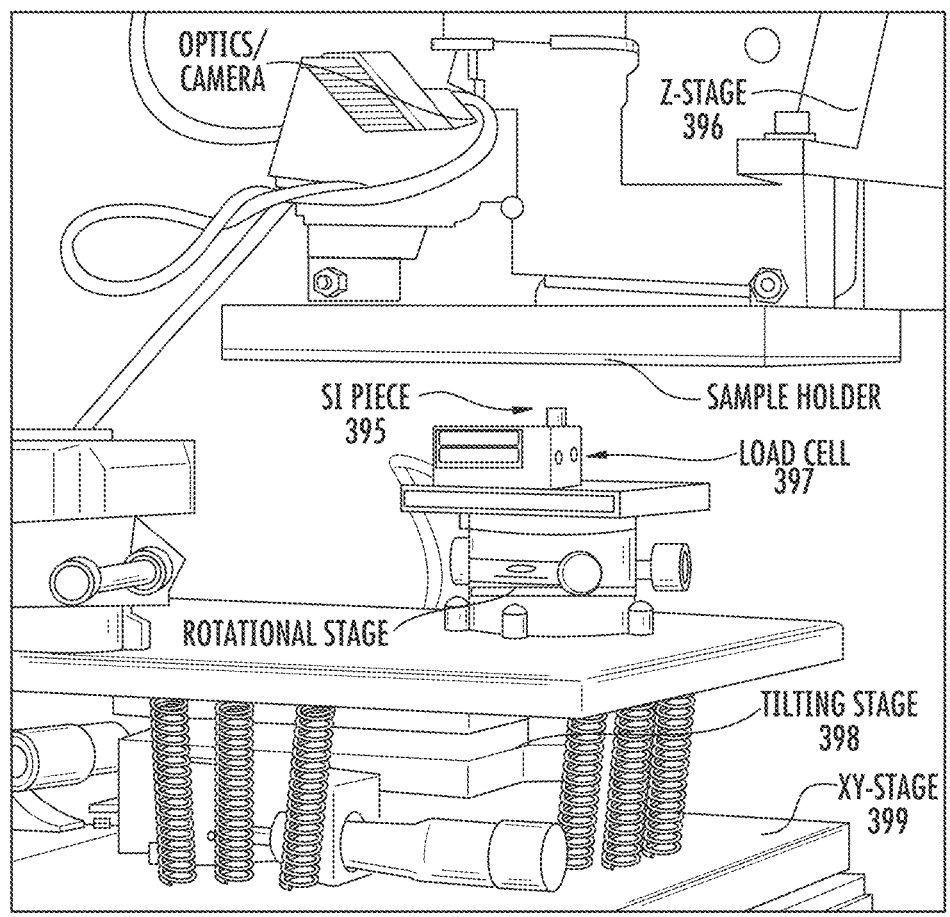
FIG. 3E illustrates an example of a custom measurement system according to some embodiments of the present invention.
Figure 3F:
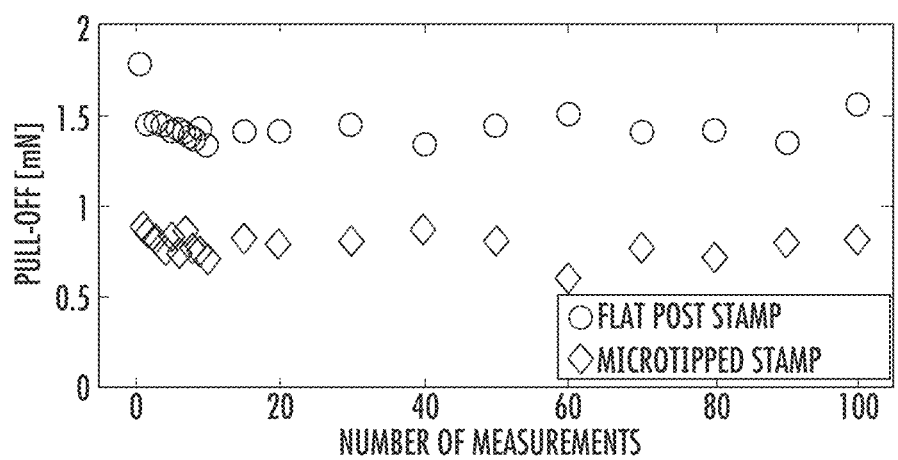
FIG. 3F is a graph illustrating pull-off force data for a stamp with a four-tipped layout in accordance with some embodiments of the present invention as compared to as stamp having a flat surface.

A custom measurement system, as shown by way of example in FIG. 3E, may be used to quantify the adhesion. An example measurement system includes motorized x, y stages 399 and a manual tilting stage 398 that supports a precision load cell 397. Microtip surfaces, such as the microtips 111 included on the surface 110 illustrated in FIGS. 1A-1G, are mounted on an independent vertical stage 396 that allows contact with a target substrate (for example, a silicon wafer 395 for the results discussed herein) at controlled speeds and forces. FIG. 3F is a graph illustrating pull-off force data for a stamp with a four-tipped layout in accordance with embodiments of the present invention as compared to as stamp with flat surface, measured repeatedly with 200 μm/s retraction speed and 2 mN preload constantly up to 100 times.

Figure 4A:
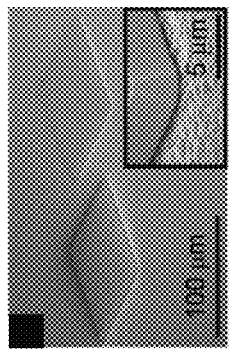
FIGS. 4A-4F are SEM images illustrating example transfer printing results achieved with microstructured elastomeric surfaces and methods in accordance with some embodiments of the present invention.

FIGS. 4A-4F are SEM images illustrating example transfer printing results using thick (about 3 μm) and thin (about 260 nm) silicon platelets (100×100 μm squares) on different surfaces and in free standing and multilayer stacked geometries, as achieved with microstructured elastomeric surfaces and methods in accordance with some embodiments of the present invention. In particular, FIG. 4A shows such platelets printed onto array of square islands (7×7 μm squares, separated by 13 μm with square packing arrangement). The ability to transfer the platelets at high yields without adhesives, particularly on structured surfaces where contact areas with the receiving surface are much smaller than the areas of the platelets themselves, illustrates the utility of microtip designs according to embodiments of the present invention, as such capabilities may not be possible with methods that use only viscoelastic effects for control.

Figure 4B:
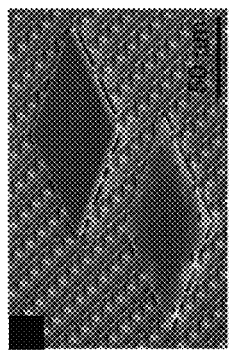

FIG. 4B illustrates a transfer printing example in accordance with embodiments of the present invention where the platelets are printed onto the rough surface of a film of ultrananocrystalline diamond (2 µm thick, root mean square (rms) roughness >70 nm with sharp facet edges) on a silicon wafer. In FIG. 4B, the contact area is estimated to be less than about 1% of the platelet area.

Figure 4C:
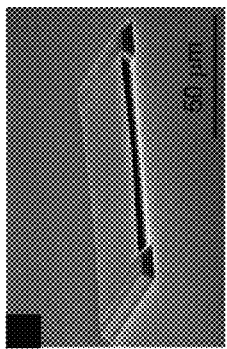
Figure 4D:
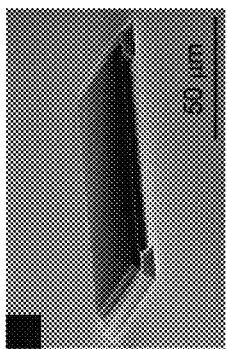

FIGS. 4C and 4D illustrate an example of transfer printing in accordance with embodiments of the present invention where the printed platelets (with thicknesses of about 3 µm (FIG. 4C) and about 260 nm (FIG. 4D)) span the gaps between pairs of silicon bars on receiver substrates. Stamps with five microtips (e.g. four tips 211 at corners of the post 205 and central tip 215 therebetween, as shown for example in FIGS. 2E and 2F) were used for printing the 260 nm thick platelets in FIG. 4D, as levels of adhesion in the printing mode can be relatively small due to contact only at the central post in the final stages of release. Thus, transfer printing operations using microstructured elastomeric surfaces according to embodiments of the present invention may allow for precision printing to yield freely suspended structures.

Figure 4E:
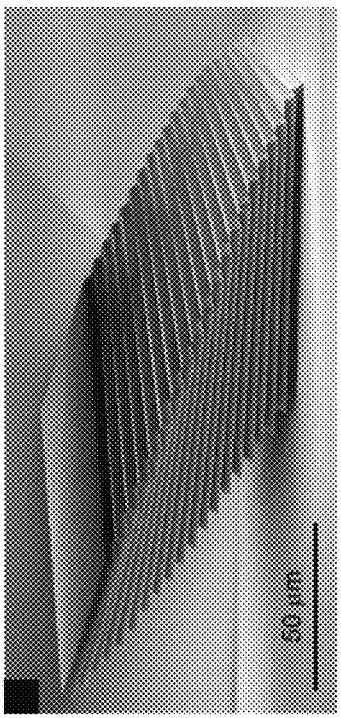
Figure 4F:
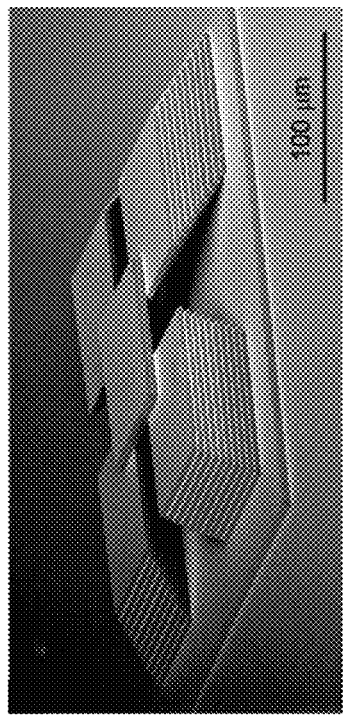

The high yield and versatility of transfer printing methods employing microstructured elastomeric surfaces in accordance with embodiments of the present invention also enable the formation of complex, three dimensional assemblies, as shown for example in FIGS. 4E and 4F. In particular, FIG. 4E illustrates a multilayer configuration of 3 µm thick silicon platelets printed in a single stack with small incremental rotations and translations on a flat silicon wafer substrate. FIG. 4F likewise illustrates the printing of 3 µm thick silicon platelets in four stacks with translational and rotational increments, capped with a pair of platelets in the center. These examples demonstrate that transfer printing using microstructured elastomeric surfaces in accordance with embodiments of the present invention are capable of constructing 3D microstructures and nanostructures that approach those constructed with macro-scale fabrication methods based on assembly of building blocks, e.g. LEGO® with silicon.

Figure 5:
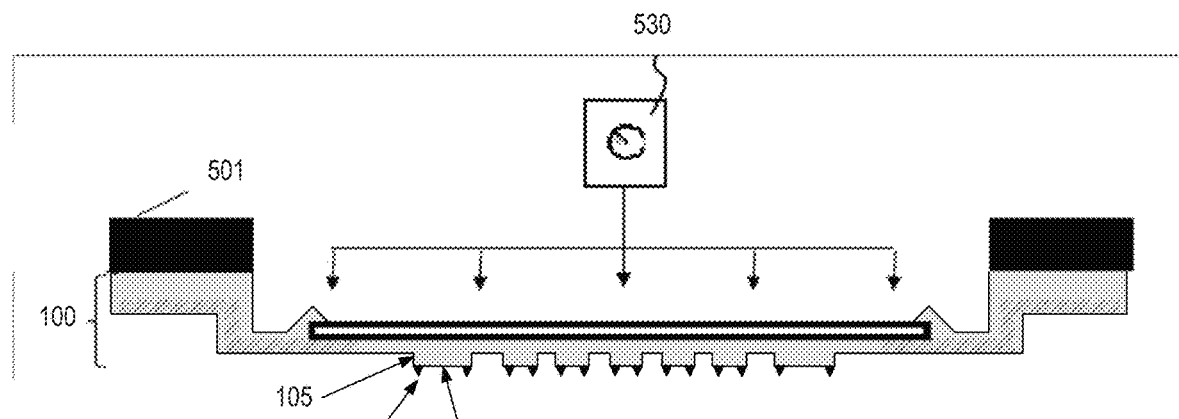
FIG. 5 is a schematic illustration of a device capable of transfer printing semiconductor elements according to some embodiments of the present invention.

FIG. 5 is a schematic illustration of a device capable of printing semiconductor elements according to some embodiments of the present invention. As shown in FIG. 5, a deformable elastomeric stamp, such as the stamp 100 described above with reference to FIGS. 1A-1F, is connected to a print tool head 501. Further detail of tool head 501 is provided in U.S. patent application Ser. No. 12/177,963, which is hereby incorporated by reference herein. As discussed above, the stamp 100 includes a plurality of protruding posts 105, and each of the posts includes a plurality of three-dimensional relief features 111 protruding from a surface 110 that faces the component to be transferred. Controller 530 is configured to operate the tool head 501 during inking and printing operations as illustrated above in FIGS. 1A-1F, and as described below with reference to the flowchart of FIG. 6.

Figure 6:
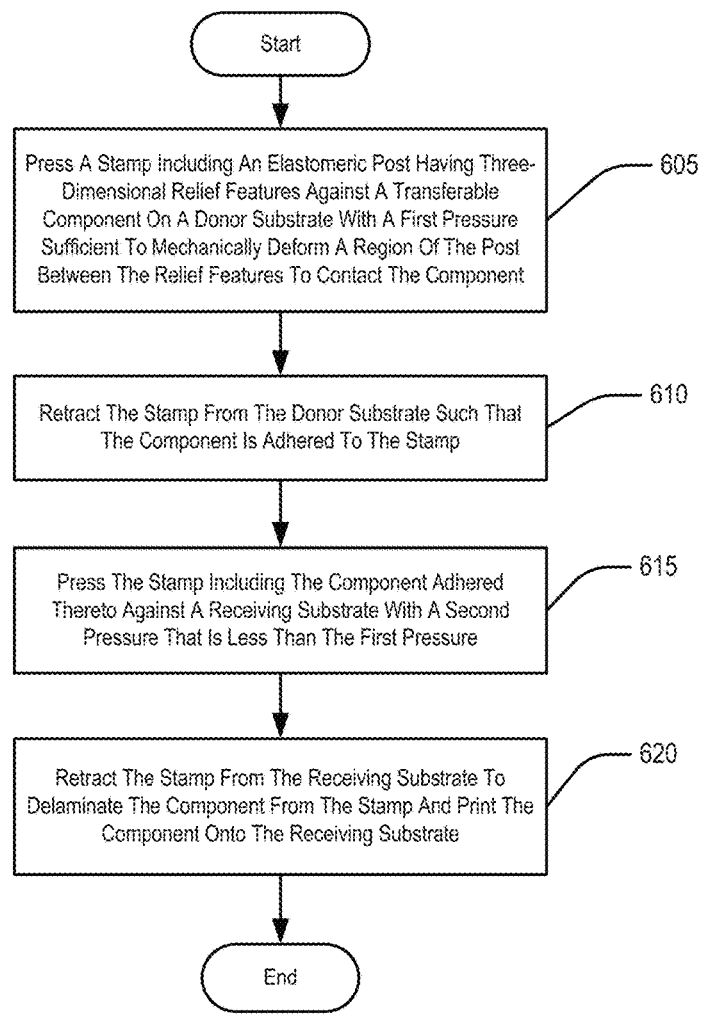
FIG. 6 is a flowchart illustrating example operations for transfer printing using stamps with microstructured elastomeric surfaces in accordance with embodiments of the present invention.

FIG. 6 is a flowchart illustrating example operations for transfer printing using stamps with microstructured elastomeric surfaces in accordance with embodiments of the present invention. As shown in FIG. 6, a stamp including an elastomeric post having three-dimensional relief features protruding from a surface thereof is pressed against a component on a donor substrate with a first pressure (block 605). The first pressure is sufficient to mechanically deform a region of the post between the relief features (as well as the relief features themselves) to contact the component over a first contact area. The stamp is retracted from the donor substrate at a relatively high speed such that the component is adhered to the stamp (block 610), thereby retrieving the component from the donor substrate.

Still referring to FIG. 6, during retraction from the donor substrate, elastic restoring forces return the relief features and the region of the post between the relief features to their original states, such that the component is adhered to the stamp over a second contact area defined by the ends or tips of the relief features. As noted above, the adhesive strength of the first contact area may be greater than that of the second contact area by a factor of 1000 or more in some embodiments. However, the elastic restoring forces associated with the post are not sufficient to delaminate the component from the stamp. The stamp including the component adhered thereto is pressed against a receiving substrate with a second pressure that is less than the first pressure (block 615). The second pressure is insufficient to mechanically deform the region of the post between the relief features to contact the component. In particular, the second pressure is sufficient to compress the relief features without collapse of the region of the post therebetween, such that the relief features contact the component over a third contact area that is smaller than the first contact area but is larger than the second contact area. The stamp is then retracted from the receiving substrate at a relatively low speed to delaminate the component from the stamp (block 620), thereby delivering or "printing" the component onto the receiving substrate.

Accordingly microtip designs as provided by embodiments of the present invention can be used in the fabrication of active devices for applications in areas ranging from photonics and metamaterials to photovoltaics and electronics.

Figure 7A:
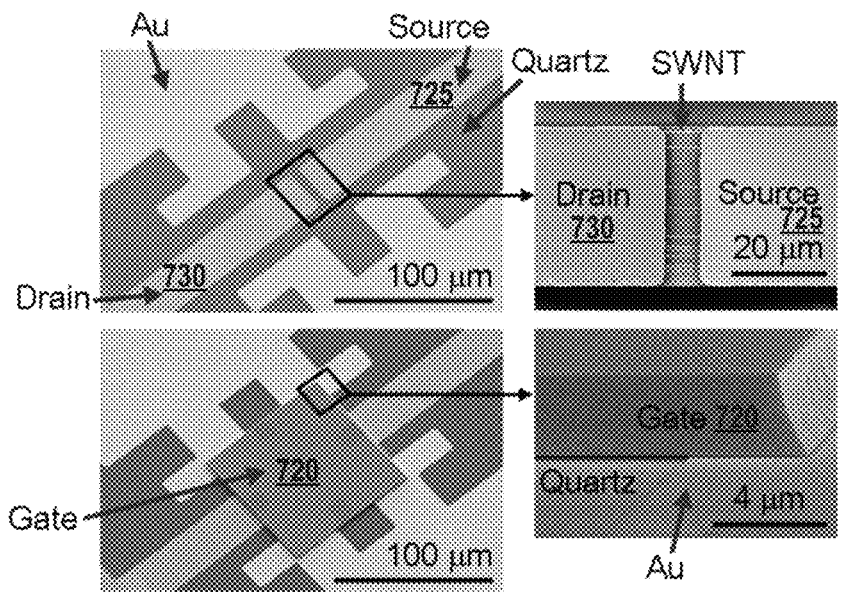
FIGS. 7A-7C illustrate an example transistor fabricating using transfer printing methods and apparatus according to some embodiments of the present invention.
Figure 7B:
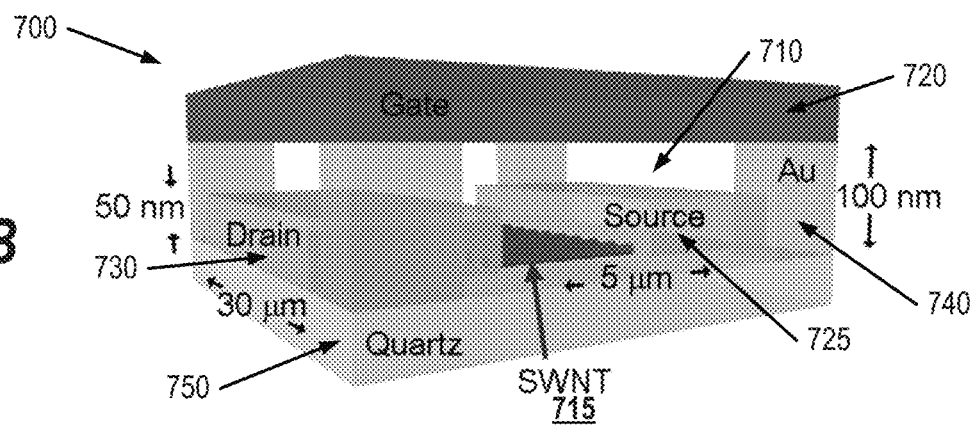
Figure 7C:
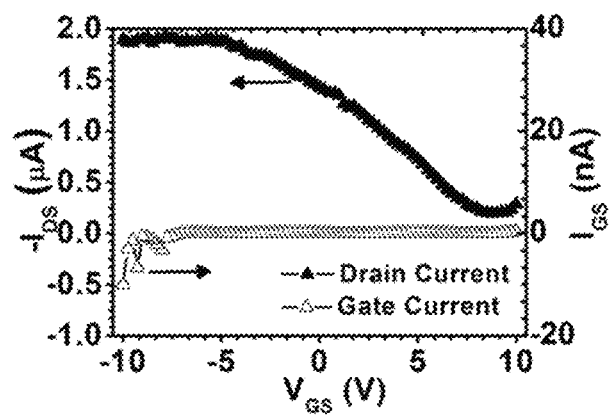

For example, FIGS. 7A-7C illustrate a transistor 700 that combines a printed gate electrode 720, an air gap dielectric 710, and a parallel array of single walled carbon nanotubes 715, which may be fabricated using microtip designs as described herein. In particular, FIG. 7A illustrates SEM images of a carbon nanotube field effect transistor (CNFET) 700 with 100 nm thick air gap dielectric 710 fabricated using transfer printing of a heavily doped ($\rho$=0.0014 $\Omega$cm) silicon platelet 720 (3 µm thick; 100 µm×100 µm). The right frames of FIG. 7A provide magnified views of the single walled carbon nanotubes (SWNTs) 715 under the silicon platelet 720 and 100 nm air gap 710 between the printed platelet 705 (which provides the gate electrode) and a quartz substrate 750 in the left frames. FIG. 7B is a schematic illustration of a perspective view of the gate 720, air gap 710, SWNTs 715, source 725, drain 730, and quartz substrate 750 of the CNFET 700 with dimensions shown. FIG. 7C is a graph illustrating transfer characteristics for the CNFET 700. Further discussion of the CNFET 700 is provided with reference to the examples below.

Figures 8A, 8B:
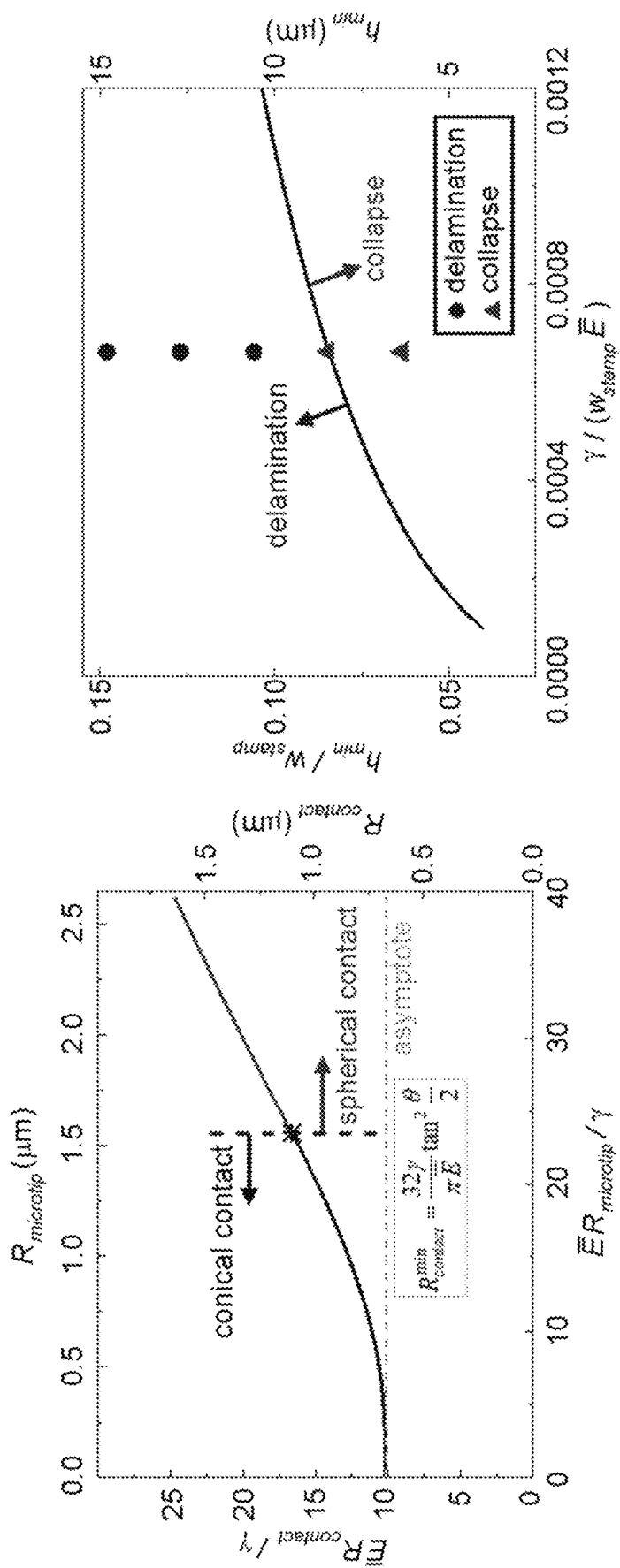
FIGS. 8A-8D are graphs illustrating characteristics of microstructured elastomeric surfaces according to some embodiments of the present invention during transfer printing operations.
Figure 8D:
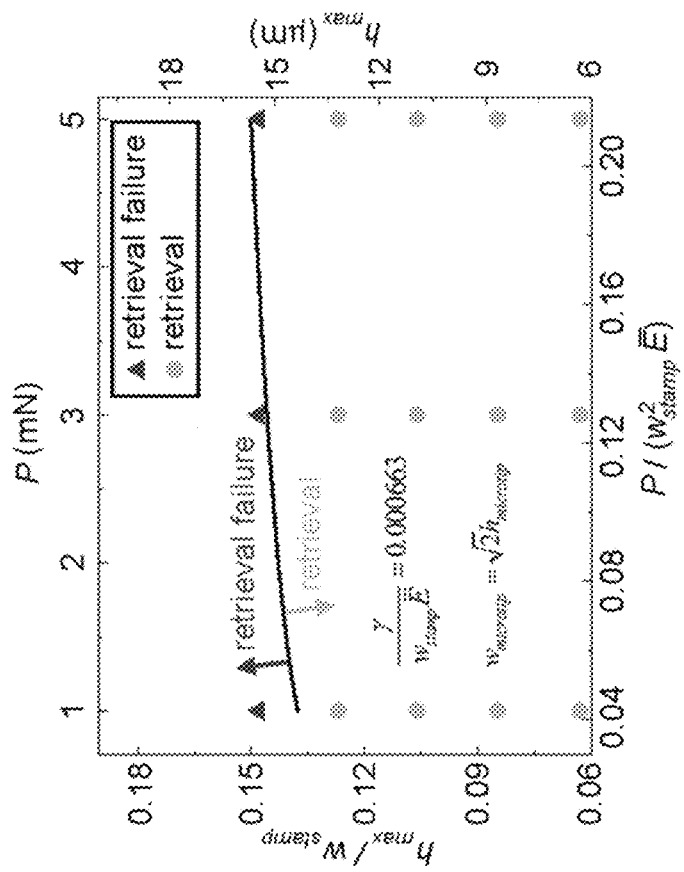
Figure 8C:
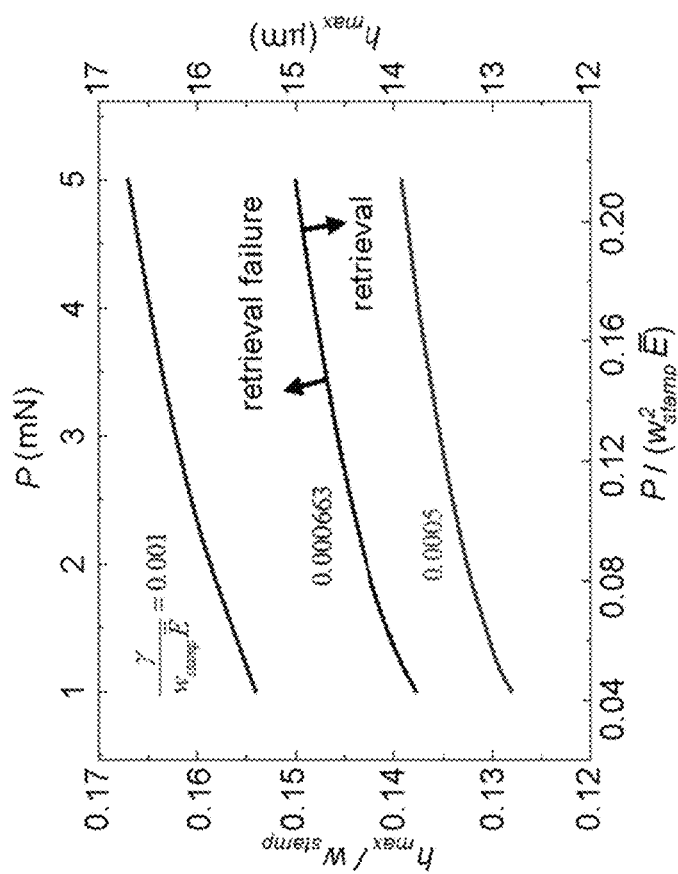

FIGS. 8A-8D are graphs illustrating microtip characteristics for use in inking and printing operations according to embodiments of the present invention. In particular, FIG. 8A illustrates the contact radius (at zero preload) between the microtips and platelet versus the microtip radius of curvature for the microtip cone angle $\theta$=90°. The asymptote for vanishing microtip radius gives minimal contact radius. FIG. 8B illustrates the minimum height of microtips versus the work of adhesion (normalized by the post width and plane-strain modulus of the stamp) for $\theta$=90°, together with the experimental data for delamination and collapse. FIG. 8C illustrates the maximum height of microtips versus the preload for several values of work of adhesion. FIG. 8D illustrates the maximum height of microtips versus the preload, together with the experimental data for retrieval and failure.

Figure 9A:
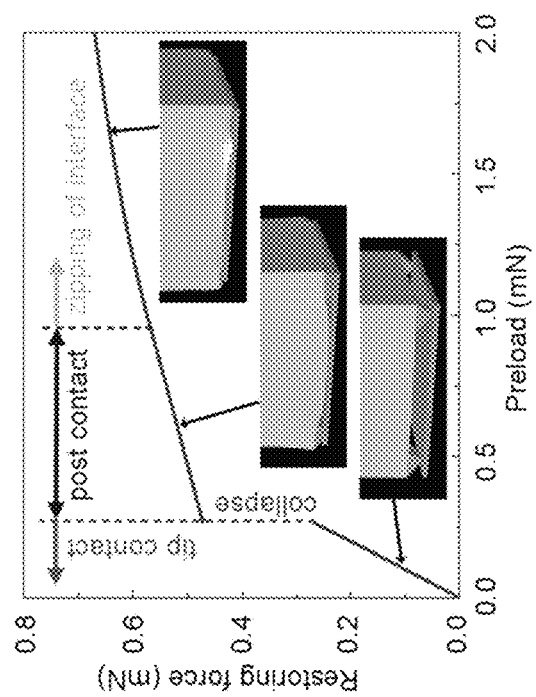
FIGS. 9A and 9B are graphs illustrating forces acting on microstructured elastomeric surfaces according to some embodiments of the present invention during transfer printing operations.
Figure 9B:
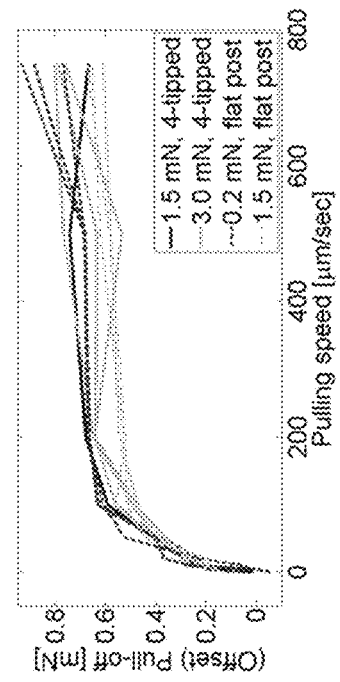

FIGS. 9A and 9B are graphs illustrating forces acting on microstructured elastomeric surfaces according to embodiments of the present invention. In particular, FIG. 9A illustrates restoring forces associated with compression of microtips on the surface of an elastomer as a function of preload, with corresponding images of finite element modeling results. FIG. 9B is a master plot showing the force required to separate an elastomer surface from a flat substrate, as a function of retraction speed for the different preload cases shown in FIGS. 3C and 3D. The data illustrated in FIG. 9B compares the cases of elastomeric posts that terminate in flat surfaces and elastomeric posts including sets of four microtips, scaled to account for the mechanics of the microtips, according to theoretical modeling.

Figure 10A:
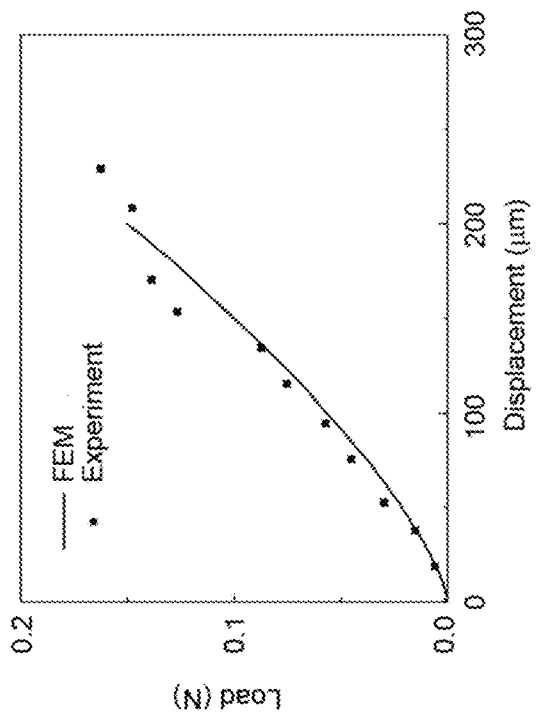
FIGS. 10A and 10B are graphs illustrating load vs. displacement for microstructured elastomeric surfaces in accordance with embodiments of the present invention.
Figure 10B:
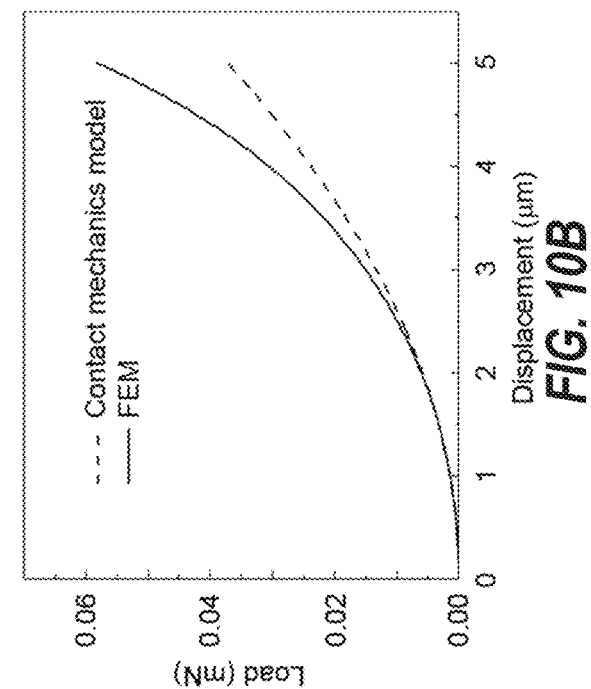

FIGS. 10A and 10B are graphs illustrating load vs. displacement for microstructured elastomeric surfaces in accordance with embodiments of the present invention according to finite element modeling, as compared with experimental data and a contact mechanics model. In particular, FIG. 10A illustrates load-displacement comparison between FEM results and experimental data, while FIG. 10B illustrates load-displacement comparison between FEM results and contact mechanics model for a PDMS microtip pressed against a silicon substrate.

Embodiments of the present invention are described in greater detail below with reference to the following examples and experimental data.

Pyramidal Relief Feature Example

Referring again to the microtip design of FIGS. 1A-1F, using a pyramid geometry for each microtip 111 has certain advantages. For example, the pyramid geometry is relatively easy to fabricate in a controlled, lithographic manner using techniques of anisotropic etching in silicon. Also, the radius of curvature of the tip can be extremely small, and is decoupled from the overall height of the relief feature (i.e. the pyramid). The underlying mechanics principles described herein are not limited to the pyramid geometry, and thus relief features in accordance with embodiments of the present invention can also employ other shapes. For instance, embodiments of the present invention may include microtips having a conical or hemispherical geometry.

The underlying physics of adhesion in surfaces described herein may be revealed by data analysis guided by theoretical mechanics modeling, which may and identify parameters for improvement or optimization. For example, the strength of the low adhesion state, where the adhesion energy per unit area in the limit of zero peel rate multiplied by the area of contact at the ends of the microtips, may be considered. FIGS. 2A and 2C show a representative case, where the stamp, made of PDMS, incorporates anisotropically etched pits in silicon (100), to yield microtips with radii of curvature, $R_{microtip}$, of less than approximately 100 nm. Contact with the silicon causes the microtips to deform, to maintain equilibrium between attraction from surface adhesion and elastic repulsion. These deformations lead to contact areas that are considerably larger than those that might be inferred based only on the geometry of the stamp. Classical models of contact mechanics can be adapted to give analytically the contact radius $R_{contact}$:

$$\frac{R_{contact}}{\gamma/\bar{E}} = s\left(\frac{R_{microtip}}{\gamma/\bar{E}}, \theta\right), \quad (1)$$

where s is a non-dimensional function of the microtip cone angle θ (shown in FIG. 2D) and $R_{microtip}$. Finite element analysis yields similar results, as shown in FIG. 2C. The value of $R_{contact}$ scales linearly with the work of adhesion γ between the PDMS and the contacting surface, and inversely with the plane-strain modulus $\bar{E}=E/(1-v^2)$ of PDMS (E—Young's modulus, v≈0.5–Poisson's ratio). Analysis shows that $R_{contact}$ decreases with $R_{microtip}$, but reaches an asymptotic value for $R_{microtip} \to 0$ given by:

$$R_{contact}^{min} = \frac{32\gamma}{\pi\bar{E}}\tan^2\frac{\theta}{2}. \quad (2)$$

These analytical models assume symmetric deformations, without any bending or buckling. The SEM and FEM results illustrated in FIGS. 2A-2D support the validity of this assumption.

For the case of a PDMS stamp and a silicon surface, where E=1.8 MPa (31) and γ=155 mJ/m², $R_{contact}$ is approximately the same as $R_{contact}^{min}$, when $R_{microtip}$ is less than approximately 100 nm. When θ=90° between two opposite edges of pyramid ($w_{microtip}=\sqrt{2}h_{microtip}$ in experiments, FIG. 1A), $R_{contact}^{min}$ is approximately 680 nm, which is comparable to 750 nm (evident from FIG. 2C), and 732 nm given by the finite element method. The conclusion, then, is that existing methods for producing elastomer surfaces in a material like PDMS can achieve values of $R_{microtip}$ well below the value which may be needed to realize minimal contact area.

Additional microtip layouts according to embodiments of the present invention can further reduce the contact area below that provided by the four tip design. FIGS. 2E and 2F show examples of such a layout including 5 microtips. As shown in FIG. 2G, during release, separation occurs first at the microtips at the corners, followed by the microtip at the center, thereby reducing the contact area immediately before complete release to about four times lower than that associated with FIG. 2C. Further reductions may be possible by increasing E (for example, by using other silicones), or decreasing γ (for example, by using related elastomers such as perfluoropolyethers), or decreasing the microtip cone angle θ.

The heights of the microtips and their nearest neighbor separations represent other parameters which may be relevant to the inking and printing operations described herein. In particular, microtip designs according to embodiments of the present invention enable unstable collapse, with near full area contact (e.g., a contact area that is substantially similar to or even greater than a cross-sectional area of the post or the surface area of a post having a substantially flat surface) in the compressed state. For a given separation, there may be a minimum height of the microtip, $h_{min}$, below which the elastic restoring force is too small to bring the relief back to its original geometry after pressure induced collapse. This minimum height can be determined by equating the strain energy in the compressed PDMS and microtips to the adhesion energy between the contacting surfaces, which gives, for the four tip design, $$h_{min} = \sqrt{\frac{w_{stamp}\gamma}{\bar{E}}\left[3.04\ln\left(\frac{w_{stamp}\bar{E}}{\gamma\tan^2\frac{\theta}{2}}\right) - 11.5\right]}, \quad (3)$$

where $w_{stamp}$ is the width of the post of the stamp. For $w_{stamp}$=100 µm (E=1.8 MPa, γ=155 mJ/m² and θ=90°, the above expression gives $h_{min}$=8.44 µm, which agrees well with the minimum height of approximately 8.5 µm observed systematically in experiments (see FIG. 8B). There also exists a maximum height, $h_{max}$, above which the elastic restoring force associated with compression of the microtips is so large that the stamp may rapidly delaminate from the platelet after the pull-off force is applied, thereby preventing large contact areas for removal of the silicon platelet (or other component 120, as illustrated in FIGS. 1A-1F) from a donor substrate. The value of $h_{max}$ can be determined analytically by equating the energy release rate to the work of adhesion between the PDMS stamp and the silicon platelet. The result is:

$$h_{max} = w_{stamp} f\left(\frac{P}{w_{stamp}^2 \bar{E}}, \frac{w_{microtip}}{w_{stamp}}, \frac{\gamma}{w_{stamp}\bar{E}}\right), \quad (4)$$

where f is a non-dimensional function of the applied force P, the microtip width ($w_{microtip}$, FIG. 1G), and the work of adhesion γ. For an applied force of 1 mN and $w_{microtip}=\sqrt{2}h_{microtip}$ (other material and geometry parameters the same as before), the maximum height is $h_{max}$=13.3 µm, which agrees reasonably well with the maximum height of approximately 12.7 µm observed from experimental data (see FIGS. 8C and 8D). These minimum and maximum values elucidate criteria that define three possible energy states of the stamp and the platelet: (i) platelet retrieval with relief collapsed, (ii) platelet retrieval with relief delaminated, (iii) failure in platelet retrieval. The microtip sizes were adjusted or optimized to obtain the second state for representative preload forces (>1 mN) and retrieval velocities (>200 µm/s). Experiments with different microtips show that when h is approximately 20% smaller or larger than this value, states (i) (platelet retrieval with relief collapsed) or (iii) (failure in platelet retrieval) with the same preloads and velocities could be achieved, respectively. The rate dependence observed in the microtip structures according to embodiments of the present invention is similar, to within experimental uncertainties, to that in flat post stamps.

For operation in the retrieval mode, the stamp should be retracted sufficiently quickly that the fracture of the interface between the platelets and their donor substrate occurs before the viscoelastic fracture of the stamp/platelet interface. During fast retraction, the compressed microtips may not have time to relax back to their original shapes; their heights remain small and the overall contact area remains high, such that the energy release rate is lower than the work of adhesion. An analytical viscoelastic model, with creep compliance data for PDMS, gives a relaxation time of about 0.052 seconds (for pulling speed of about 460 µm/s), at which the collapsed stamp starts to debond from the substrate. For relatively fast retraction (pulling speed >200 µm/s), this timescale is roughly consistent with experimental observation because the time for complete separation of the stamp/substrate interface is about the same as the time for initial debonding. Additionally, this viscoelastic analysis predicts a pull-off force that is in quantitative agreement with the experiments at pulling speeds >200 µm/s, as shown in FIG. 3C. For pulling speeds <200 µm/s, the analysis gives a larger pull-off force than the experiments because the debonding may gradually propagate along the stamp/substrate interface due to slow retraction, but the model does not account for crack propagation along the interface. Improved analysis and comparison to experiment may require accurate measurements of creep compliance in our PDMS and direct visualization of the interface using high speed imaging techniques.

The force-distance curves and other behaviors of FIGS. 3A-3D can also be captured by mechanics modeling. For the case of FIG. 3A, modeling predicts two slopes, as observed in experiment: $k_{microtip}$ when contact occurs only at the microtips, and $k_{post}$ for contact at both the microtips and the intervening regions. In particular, analysis yields $$\frac{1}{k_{microtip}} = \frac{1}{k_{post}} + \quad (5)$$
$$\frac{1}{\bar{E}w_{microtip}}\left[\frac{3h_{microtip}}{4w_{microtip}} + \frac{1}{\pi}\left(\frac{w_{microtip}}{w_{stamp}} - 2\frac{w_{microtip}^3}{w_{stamp}^3}\right)\ln\left(\frac{w_{stamp}^2}{2w_{microtip}^2} - 1\right)\right].$$

For $k_{microtip}$=30 N/m and $k_{post}$=90 N/m shown in FIG. 3A, and $h_{microtip}$=10.6 µm and width $w_{microtip}=\sqrt{2}h_{microtip}$=15 µm from experiments, the left- and right-hand sides of Eq. (5) give 0.033 m/N and 0.036 m/N, respectively. This substantially similar level of agreement validates the modeling, and its further use in examining the differences between FIG. 3C and FIG. 3D to gain insights into the adhesion mechanics. In the collapsed state, the microtips provide forces that add to the externally applied force needed to cause delamination. This effect can be explored through calculation. In particular, the mechanics models described previously yield analytical forms for the restoring force, F, associated with the compressed microtips. The result takes the form:

$$F = w_{stamp}^2 \bar{E} g\left(\frac{P}{w_{stamp}^2 \bar{E}}, \frac{w_{microtip}}{w_{stamp}}, \frac{h_{microtip}}{w_{stamp}}\right), \quad (6)$$

where g is a non-dimensional function of the applied force P, microtip width $w_{microtip}$ and height $h_{microtip}$. This force, as shown in FIG. 9A, is the same as the preload when only the microtips contact the platelet. The sudden increase in the restoring force corresponds to the collapse of post between microtips. This force then increases linearly with the preload (shown as "post contact" in FIG. 9A), but with reduced slope due the elasticity of the post. This dependence is followed by a nonlinear increase, at a reduced rate because the contact area also increases ("zipping of interface" in FIG. 9A). For an applied force of 1.5 mN, the total restoring force is 0.63 mN for the collective effect of four microtips with height $h_{microtip}$=10.6 µm and width $w_{microtip}=\sqrt{2}h_{microtip}$=15 µm (other material and geometry parameters are the same as above). This restoring force is larger than the preload of about 0.39 mN sufficient to collapse the regions between the microtips (i.e., the position in the curve of FIG. 3A that occurs at the point where the linear slope changes) because the microtips continue to be compressed after the intervening regions collapse (see FIG. 9A). FIG. 9B illustrates a master plot obtained by shifting the data of FIG. 3D downward along the y-axis by an amount equal to the total restoring force evaluated by modeling, and the plotting results together with the data of FIG. 3C. The overlap of the resulting curves, to within experimental uncertainty, supports the modeling and the associated interpretation of the underlying physics.

Device Assembly Example

To demonstrate a device assembly example, a class of transistor was built that combines a printed gate electrode 720, an air gap dielectric 710, and a parallel array of single walled carbon nanotubes 715. FIG. 7A shows such a device, with a 100 nm thick air gap dielectric 710 and a gate electrode 720 that consists of a heavily doped ($\rho$=0.0014 $\Omega$cm) silicon platelet (3 µm thick; 100 µm×100 µm), delivered to the device structure by printing. Strategically located patterns 740 of thin metal films provide support structures at the corners of the platelet 720 to define its physical separation from the nanotubes 715 (i.e. the thickness of the air gap dielectric 710). After growing aligned single walled carbon nanotubes (SWNTs) 715 by chemical vapor deposition (CVD), source and drain electrodes 725 and 730 were defined by electron-beam evaporation with 1 nm thick Ti and 49 nm thick Pd followed by consecutive lift off process in acetone. A peripheral area of SWNT was removed with oxygen reactive ion etching to yield electrically isolated devices. An air gap spacer 710 with 100 nm thick gold was made by electron-beam evaporation and lift off process. A heavily doped ($\rho$=0.0014 $\Omega$cm) silicon platelet 720 was transfer printed on a patterned PDMS surface, and then the residue of photoresist anchors was removed with acetone. Finally, the cleaned platelet 720 was transfer printed from the PDMS surface to the air gap spacer 710 and annealing process was performed on a hot plate at 200° C. for 30 minutes in ambient argon.

The variation in source/drain current ($I_{DS}$) as a function of gate voltage ($V_{GS}$) at a source/drain bias ($V_{DS}$) of −0.05 V for a representative device shown in FIG. 7B with a channel length of 5 µm and a channel width of 30 µm is illustrated in FIG. 7C. Gate leakage currents less than 10 pA were observed at $V_{GS}$ up to 7 V, where the field strength is somewhat larger than 2 MV/cm. Increased currents occur for higher voltages, somewhat lower than those expected based on air breakdown according to Pashen's law. Accurate models of the capacitance coupling of the printed gate 720 to the array of tubes 715 (having densities of approximately 0.5 tubes/µm) can be used together with the measured properties shown in FIG. 7C to estimate the mobility to be approximately 1500 cm²/Vsec, which may be comparable to values reported for devices with conventional layouts. The type of device 700 discussed herein may be used in numerous applications, such as sensing in gases or liquids, where both gate modulation and physical access to the nanotubes may be required.

Contact Radius at Zero Preload

The shape of microtips can be represented by a spherical portion near the tip and a conical portion in the cylindrical coordinates (r,z), $$z = f(r) = \begin{cases} R_{microtip} - \sqrt{R_{microtip}^2 - r^2} & 0 \leq r \leq R_{microtip}\cos\frac{\theta}{2} \\ \dfrac{r}{\tan\frac{\theta}{2}} - R_{microtip}\left(\dfrac{1}{\sin\frac{\theta}{2}} - 1\right) & r > R_{microtip}\cos\frac{\theta}{2} \end{cases} \quad (S1)$$

The contact mechanics model relates the radius of contact $R_{contact}$ to the above shape function f(r), work of adhesion $\gamma$, and plane-strain modulus $\bar{E}$ by $$\frac{\bar{E} R_{contact}}{2\pi}\left[\frac{\delta}{R_{contact}} - \int_0^{R_{contact}} \frac{f'(r)dr}{\sqrt{R_{contact}^2 - r^2}}\right]^2 = \gamma, \quad (S2)$$

where $\delta$ is related to the preload P by $$P = 2\bar{E}\int_0^{R_{contact}}\left[\delta - t\int_0^t \frac{f'(r)dr}{\sqrt{t^2 - r^2}}\right]dt. \quad (S3)$$

For zero preload P=0, $\delta$ is given by $$\delta = \frac{1}{R_{contact}}\int_0^{R_{contact}} \sqrt{R_{contact}^2 - r^2}\, f'(r)dr. \quad (S4)$$

Its substitution in Eq. (S2) gives the equation for $R_{contact}$ $$\frac{\bar{E}}{2\pi R_{contact}^3}\left[\int_0^{R_{contact}} \frac{r^2 f'(r)dr}{\sqrt{R_{contact}^2 - r^2}}\right]^2 = \gamma. \quad (S5)$$

For the shape function in Eq. (S1), Eq. (S5) gives the following equation for the ratio of radii $$\eta = \frac{R_{microtip}}{R_{contact}}, \quad (S6)$$

$$\eta - \frac{\cos^{-1}\left(\eta\cos\frac{\theta}{2}\right)}{\tan\frac{\theta}{2}} - \eta\frac{\sqrt{1 - \eta^2\cos^2\frac{\theta}{2}}}{\sin\frac{\theta}{2}} +$$

$$(1+\eta^2)\ln\frac{\sqrt{1-\eta^2\cos^2\frac{\theta}{2}} + \eta\sin\frac{\theta}{2}}{1+\eta} + 2\sqrt{\eta}\sqrt{\frac{2\pi\gamma}{\bar{E} R_{microtip}}} = 0.$$

This gives the implicit expression in Eq. (1). The contact radius, normalized by $$\frac{\gamma}{\bar{E}},$$

is shown in FIG. 8A, and so is $R_{contact}$ for material properties in the experiment. For $R_{microtip} \to 0$, it gives analytically the asymptote in Eq. (2).

Equation (S6) holds for conical contact between the microtips and platelet for a relatively small microtip radius of curvature, $$\frac{\bar{E} R_{microtip}}{\gamma} \leq \frac{8\pi\cos^3\frac{\theta}{2}}{\left[\left(1+\cos^2\frac{\theta}{2}\right)\ln\left(\tan\frac{\theta}{4}\right) + \cos\frac{\theta}{2}\right]^2}. \quad (S7)$$

For microtip radius of curvature exceeding this value, the contact between the microtips and platelet remains in the spherical portion, and the corresponding contact radius has been obtained analytically. The contact radii corresponding to conical and spherical contact are also shown graphically in FIG. 8A.

Finite Element Analysis of Contact Radius

The contact radii in Eqs. (1) and (2) are derived from classical models of contact mechanics, developed for the case of a rigid indenter in contact with a soft material. Similar models can be applied to soft indenters in contact with hard materials. For example, researchers have measured the indentation load-displacement curve for a conical indenter of soft rubber in contact with a hard, soda-lime glass. The Young's moduli of rubber (2.45 MPa) and glass (70 GPa) are comparable to those of PDMS (1.8 MPa) and silicon (130 GPa), respectively. Table S1 summarizes the geometry and elastic properties of the conical rubber indenter with a round tip.

TABLE S1

Geometry and elastic properties of the rubber indenter

| Cone angle | Maximum radius | Tip radius | Young's modulus | Poisson's ratio |
|---|---|---|---|---|
| 60 degree | 5 mm | 0.23 mm | 2.45 MPa | 0.4999999 |

This axisymmetric indentation problem was studied using the finite element method (FEM), which accounts for the geometric nonlinearity (large change of indenter shape) during indentation. Axisymmetric elements were used for the rubber indenter, including the detailed geometry of the indenter tip. The element size was approximately 0.0345 mm, which is 7 times smaller than the indenter tip radius, and 150 times smaller than the maximum indenter radius. Refined meshes were used to ensure that the numerical results converge. The contact between the rubber indenter and the glass expands from an initial cone tip to a conical region as the indentation load increases. A finite sliding, hard contact model was used, to allow for the possibility of sliding between contact surfaces without interpenetration. The normal and shear stress were continuous within the contact process zone. The friction at the contact interface was also accounted for, but it had negligible effect on the indentation load-displacement: the difference between frictionless contact and contact with a large friction coefficient was less than 0.2%. The results of the indentation load versus displacement (shown in FIG. 10A) indicate excellent agreement between FEM and experiments. This outcome validates the use of FEM for a soft indenter in contact with a hard material.

TABLE S2

Geometry and elastic properties of PDMS microtips

| Pyramid angle | Maximum height | Tip radius | Young's modulus | Poisson's ratio |
|---|---|---|---|---|
| 90 degree | 10.6 μm | 100 nm | 1.8 MPa | 0.48 |

Table S2 summarizes the geometry and elastic properties of pyramid microtips of PDMS used in the experiments. Silicon served as the contacting substrate. The element size was approximately 1.5 nm, which is about 70 times smaller than the indenter tip radius, and about 7,000 times smaller than the maximum height of microtip. FIG. 10B shows the resulting force versus displacement curve on each microtip, and a comparison to the contact mechanics model (with cone angle 90°) specified in Eqs. (S2) and (S3), in which P and δ represent the indentation load and displacement, respectively. The numerical and analytical results agree well at small displacements, but begin to deviate as the displacement increases beyond a couple of microns. The present use of the contact mechanics model involves the determination of contact area in the limit of extremely small displacements, associated with zero imposed compressive load. The results in FIGS. 10A and 10B indicate that the model may be applicable for embodiments of the present invention.

A more direct validation of the contact mechanics model is to use FEM to determine the contact radius for the experimental system. To accomplish this goal, the microtips were compressed into contact with the silicon, and then the load was released completely, which delaminates the microtip/platelet interface with a work of adhesion $\gamma=155$ mJ/m². FEM gives a contact radius of 732 nm, which is slightly larger than 680 nm obtained from Eq. (2) based on the contact mechanics model. Both values, however, agree (within experimental uncertainties of approximately 100 nm) with that determined from analysis of scanning electron microscope images (i.e., 750 nm). The lower right frame of FIG. 2C shows the deformed FEM mesh of final contact (in this zero compressive load regime).

Minimum Height of Microtips

A minimum height of the microtips may correspond to the state of vanishing preload at which the elastic energy in the stamp due to the collapse of the post equals the adhesion energy between the stamp and platelet. The latter equals the product of work of adhesion $\gamma$ and contact area, while the former can be obtained using an approach based on fracture mechanics, which accounts for the finite geometry of the stamp, such as the stamp width $w_{stamp}$ and contact radius $R_{contact}$ between the microtips and platelet. The contact area may be determined analytically by reducing or minimizing the total potential energy, which equals the elastic energy in the stamp subtracted by the adhesion energy. The minimum height of microtips may be defined analytically as $$h_{min} = \sqrt{\frac{w_{stamp}\gamma}{\bar{E}}\left[3.04\ln\left(\frac{w_{stamp}}{R_{contact}}\right) - 4.44\right]}, \quad (S8)$$

where the factors 3.04 and 4.44 result from the stress intensity factor for finite geometry in fracture mechanics. The substitution of the asymptote in Eq. (2) for $R_{contact}$ leads to the analytical expression in Eq. (3). FIG. 8B illustrates that a minimum height of microtips (normalized by post width $w_{stamp}$) increases with the work of adhesion $\gamma$, but decreases with the plane-strain modulus of the stamp. The minimum height for the material properties and post width in experiments is also shown. The experimental data for delamination (above the curve) and collapse (on or below the curve) agree with the model.

Analysis of Stamp Collapse Process

For microtip heights larger than $h_{min}$ in Eq. (3), the process of stamp collapse includes 4 stages as the preload P increases, (i) microtip contact, during which only microtips contact the platelet; (ii) post collapse, which corresponds to a sudden increase of contact area between the post and platelet; (iii) post contact, during which the contact area remains the same as the preload increases; and (iv) zipping of interface, which corresponds to the increase of contact area with the preload.

(i) microtip contact: The deformation in the microtips and post is studied by linear elasticity, where the microtips are subject to uniaxial compression, and the post is subject to the preload and reaction forces from the microtips.

(ii) post collapse: The analysis is similar to that for the minimum height, except that the total potential energy includes the external work of the preload. It gives following three equations to determine the ratio $c_{collapse}$ of contact area to stamp area at collapse, the corresponding critical load $P_{collapse}$, and the compressed height $h_{collapse}$ of microtips at collapse, $$\frac{1}{F_1(b)}\left(\frac{h_{collapse}}{w_{stamp}}\right)^2 \frac{K\left(\frac{c_{collapse}}{b}\right)}{K\left[\sqrt{1-\left(\frac{c_{collapse}}{b}\right)^2}\right]} - \qquad (S9)$$

$$\frac{h_{collapse}}{w_{stamp}}\frac{P_{collapse}}{w_{stamp}^2\overline{E}}\left[c_{collapse} + \right.$$

$$\left.\left(\sqrt{2bc_{collapse}+2c_{collapse}^2}-2c_{collapse}\right)F_2(b-c_{collapse})\right] +$$

$$\frac{3h_{microtip}}{4w_{stamp}}(1-b)\left(\ln\frac{h_{collapse}}{h_{microtip}}\right)^2 - \frac{4h_{microtip}}{3w_{stamp}}\frac{1}{1-b}\left(\frac{P_{collapse}}{w_{stamp}^2\overline{E}}\right)^2 -$$

$$\frac{2\gamma}{w_{stamp}\overline{E}}c_{collapse}=0,$$

$$\frac{1}{F_1(b)}\left(\frac{h_{collapse}}{w_{stamp}}\right)^2 \frac{d}{dc}\left\{\frac{K\left(\frac{c}{b}\right)}{K\left[\sqrt{1-\left(\frac{c}{b}\right)^2}\right]}\right\}\bigg|_{c=c_{collapse}} - \frac{h_{collapse}}{w_{stamp}}\frac{P_{collapse}}{w_{stamp}^2\overline{E}} \qquad (S10)$$

$$\left[1+\left(\frac{b+2c_{collapse}}{\sqrt{2bc_{collapse}+2c_{collapse}^2}}-2\right)F_2(b-c_{collapse})-\right.$$

$$\left.\left(\sqrt{2bc_{collapse}+2c_{collapse}^2}-2c_{collapse}\right)F_2'(b-c_{collapse})\right] -$$

$$\frac{2\gamma}{w_{stamp}\overline{E}}=0,$$

$$\frac{1}{F_1(b)}\frac{h_{collapse}^2}{w_{stamp}h_{microtip}}\frac{K\left(\frac{c_{collapse}}{b}\right)}{K\left[\sqrt{1-\left(\frac{c_{collapse}}{b}\right)^2}\right]} + \qquad (S11)$$

$$\frac{3(1-b)}{4}\ln\frac{h_{collapse}}{h_{microtip}} - \frac{h_{collapse}}{h_{microtip}}\frac{P_{collapse}}{w_{stamp}^2\overline{E}}[F_2(b-c_{collapse})$$

$$\left(\sqrt{2bc_{collapse}+2c_{collapse}^2}-2c_{collapse}\right)-1+c_{collapse}]=0,$$

where $$b=1-\frac{4w_{microtip}^2}{3w_{stamp}^2},\ K(k)=\int_0^{\frac{\pi}{2}}\frac{d\varphi}{\sqrt{1-k^2\sin^2\varphi}}$$

is the elliptical function of the first kind, $$F_1(k)=-0.417-1.071\ \ln(1-k),$$

and $$F_2(k)=(1-0.25\ k+0.093k^2-0.005\ k^3)/\sqrt{1-0.5k}.$$

(iii) post contact: The contact area is the same as that in (ii), but the energy release rate at the boundary of contact decreases as the preload increases. The compressed height h' of microtips decreases with the increase of preload, and is given by $$\frac{1}{F_1(b)}\frac{h'^2}{w_{stamp}h_{microtip}}\frac{K\left(\frac{c_{collapse}}{b}\right)}{K\left[\sqrt{1-\left(\frac{c_{collapse}}{b}\right)^2}\right]} + \qquad (S12)$$

$$\frac{3(1-b)}{4}\ln\frac{h'}{h_{microtip}} - \frac{h'}{h_{microtip}}\frac{P}{w_{stamp}^2\overline{E}}[F_2(b-c_{collapse})$$

$$\left(\sqrt{2bc_{collapse}+2c_{collapse}^2}-2c_{collapse}\right)-1+c_{collapse}]=0.$$

(iv) zipping of interface: The energy release rate at the boundary of contact reaches and remains at zero, and the contact area increases with the preload. The ratio c of contact area to stamp area increases with the preload, while the opposite holds for the compressed height h' of microtips, and they are given by $$\frac{1}{F_1(b)}\frac{h'^2}{w_{stamp}h_{microtip}}\frac{K\left(\frac{c}{b}\right)}{K\left[\sqrt{1-\left(\frac{c}{b}\right)^2}\right]} + \frac{3(1-b)}{4}\ln\frac{h'}{h_{microtip}} - \qquad (S13)$$

$$\frac{h'}{h_{microtip}}\frac{P}{w_{stamp}^2\overline{E}}[F_2(b-c)(\sqrt{2bc+2c^2}-2c)-1+c]=0,$$

$$h'=F_1(b)\frac{P}{w_{stamp}\overline{E}}\left(1-\frac{c}{b}\right)\sqrt{\frac{c}{2}(b+c)}\ K\left[\sqrt{1-\left(\frac{c}{b}\right)^2}\right]F_2(b-c). \qquad (S14)$$

This analysis provides the slope change in the preload-distance curve (shown FIG. 3A), maximum height of the microtips, and restoring force in the microtips, as follows.

Slope Change in the Preload-Distance Curve

The distance in FIG. 3A before post collapse includes the (compressive) displacements in microtips and in the post. The microtips are subject to uniaxial compression, while the post is modeled as a semi-infinite solid subject to remote compression and forces from the microtips on the surface. The ratio of preload to this distance gives the slope $k_{microtip}$ $$\frac{1}{k_{microtip}}=\frac{1}{w_{microtip}\overline{E}}\left[\frac{3h_{microtip}}{4w_{microtip}} + \right.$$

$$\left.\frac{1}{\pi}\left(\frac{w_{microtip}}{w_{stamp}}-\frac{2w_{microtip}^3}{w_{stamp}^3}\right)\ln\left(\frac{w_{stamp}^3}{2w_{microtip}^2}-1\right)\right] + \frac{h_{stamp}}{w_{stamp}^2\overline{E}}, \qquad (S15)$$

where $h_{stamp}$ is the effective height of the stamp (FIG. 1G). The change of distance in FIG. 3A after post collapse also includes contributions from the microtips and from the post, but the former may become negligible as compared to the latter. The ratio of preload increment to distance increment gives the slope $k_{post}$ $$\frac{1}{k_{post}}=\frac{h_{stamp}}{w_{stamp}^2\overline{E}}. \qquad (S16)$$

Eqs. (S15) and (S16) lead to Eq. (5).

Restoring Force in Microtips

The restoring force microtips is given by $$F = P\left[\left(\sqrt{2bc+2c^2}-2c\right)F_2(b-c)-1+c\right] - \frac{w_{stamp}\overline{E}}{F_1(b)}\frac{K\left(\frac{c}{b}\right)}{K\left[\sqrt{1-\frac{c^2}{b^2}}\right]}h', \quad (S17)$$

where c and h' are determined from Eqs. (S9) to (S14) for stages (ii)-(iv).

Maximum Height of Microtips

A maximum height of microtips may be determined by equating the energy release rate to the work of adhesion, which gives the following relation to determine c $$\frac{\pi P^2}{4w_{stamp}^2\overline{E}}(b-c)[F_2(b-c)]^2 = \gamma. \quad (S18)$$

Eq. (S14) then gives explicitly h'. The maximum height of microtips, $h_{max}$, is obtained from Eq. (S13) by replacing $h_{microtip}$ with $h_{max}$. FIG. 8C shows that the maximum height of microtips (normalized by post width $w_{stamp}$) increases with the preload as well as the work of adhesion γ, but decreases with the plane-strain modulus of the stamp. The maximum height for the material properties and post width in experiments is also shown. The experimental data for retrieval (below the curve) and failure (above the curve) agree with the model.

Viscoelastic Analysis

For operation in retrieval mode, the PDMS stamp is retracted sufficiently quickly to ensure that the platelet/substrate interface fractures, but the stamp/platelet interface does not, due to effects of viscoelastic behavior in the PDMS. The creep compliance of PDMS, is a material property that governs this process. This quantity can be represented by a piece-wise relation $$\frac{C(t)}{C(\infty)} = \begin{cases} 0.198 \times [6.14 + \log(t)] & 0.0001 < t < 0.08 \\ 1 & 0.08 < t \end{cases}, \quad (S19)$$

which is a non-decreasing function of time t (unit: second). The viscoelastic energy release rate G is related to the stress intensity factor K(t) via the creep compliance by $$G = \frac{1}{2\overline{E}}\frac{C(t)}{C(\infty)}K^2(t), \quad (S20)$$

where $\overline{E}$ is the plane-strain modulus of PDMS, and the factor ½ accounts for the elastic mismatch between PDMS and silicon. The stress intensity factor K(t) is given by $$K_I = \frac{\overline{E}h''}{F_1(b)}\sqrt{\frac{\pi}{2w_{stamp}c\left[1-\left(\frac{c}{b}\right)^2\right]}}\frac{1}{K\left[\sqrt{1-\left(\frac{c}{b}\right)^2}\right]} + \quad (S21)$$

$$\frac{P''}{2w_{stamp}}\sqrt{\frac{\pi(b-c)}{w_{stamp}}}F_2(b-c),$$

where $w_{stamp}$ is the stamp width, b and functions $F_1$, $F_2$ and K are defined after Eq. (S11), c is solved from Eqs. (S13) and (S14), P'' is the pull-off force, and the microtip height h'' is related to P'' by $$\frac{1}{F_1(b)}\frac{h''^2}{w_{stamp}h_{microtip}}\frac{K\left(\frac{c}{b}\right)}{K\left[\sqrt{1-\left(\frac{c}{b}\right)^2}\right]} + \frac{3(1-b)}{4}\ln\frac{h''}{h_{microtip}} + \quad (S22)$$

$$\frac{h''}{h_{microtip}}\frac{P''}{w_{stamp}^2\overline{E}}\left[F_2(b-c)\left(\sqrt{2bc+2c^2}-2c\right)-1+c\right] = 0,$$

which is identical to Eq. (S13) except that P and h' are replaced by -P'' and h'', respectively.

The pull-off force is related to the pulling speed $v_{pulling}$ and time t by $$P''=w_{stamp}\overline{E}(v_{pulling}-L_{compression}) \quad (S23)$$

after the compression force P is relaxed, where $L_{compression}$ is the compressed distance of the stamp due to P, and $L_{compression}$=20 μm from FIG. 3A.

The stamp/platelet interface will not delaminate if the viscoelastic energy release rate remains smaller than the work of adhesion γ, i.e., $$G<\gamma. \quad (S24)$$

For the given material properties, the creep compliance in Eq. (S19), and a pulling speed $v_{pulling}$=460 μm/s, the above inequality gives a time of about 0.052 second for the stamp/platelet interface stating to debond. The pull-off force is then obtained from Eq. (S23).

Accordingly, embodiments of the present invention provide methods for deterministic assembly of solid microscale or nanoscale parts into two and three dimensional configurations, and some theoretical foundation for understanding key design parameters. The embodiments discussed herein provide experimental data and theoretical models on the use of microstructures of relief on elastomeric surfaces to achieve pressure induced switching in adhesion strength. Theoretically guided design improvement or optimization yields high levels of control, with more than three orders of magnitude difference between the forces measured in strong and weak adhesive states. These characteristics enable transfer printing reliably and repeatedly with very high yield (almost 100%) in new modes, for numerous applications. Adhesion may be further increased relative to the corresponding flat surface using vacuum effects or notched features on the sidewalls of the posts. These and other structural designs can be further enhanced through the introduction of new materials, using guidance from mechanical models similar to those presented herein and the viscoelastic effect model on elastomeric microtip surface adhesion during high speed part retrieval.

Various embodiments are described herein with reference to flowchart illustrations of computer-implemented methods, apparatus (systems and/or devices) and/or computer program products. It is understood that a block of the flowchart illustrations, and combinations of blocks in the flowchart illustrations, can be implemented by computer program instructions that are performed by one or more computer circuits. These computer program instructions may be provided to a processor circuit of a general purpose computer circuit, special purpose computer circuit, and/or other programmable data processing circuit to produce a machine, such that the instructions, which execute via the processor of the computer and/or other programmable data processing apparatus, transform and control transistors, values stored in memory locations, and other hardware components within such circuitry to implement the functions/acts specified in the block diagrams and/or flowchart block or blocks, and thereby create means (functionality) and/or structure for implementing the functions/acts specified in the block diagrams and/or flowchart block(s)

These computer program instructions may also be stored in a tangible, non-transitory computer-readable medium that can direct a computer or other programmable data processing apparatus to function in a particular manner, such that the instructions stored in the computer-readable medium produce an article of manufacture including instructions which implement the functions/acts specified in the flowchart blocks.

The computer program instructions may also be loaded onto a computer and/or other programmable data processing apparatus to cause a series of operational steps to be performed on the computer and/or other programmable apparatus to produce a computer-implemented process such that the instructions which execute on the computer or other programmable apparatus provide steps for implementing the functions/acts specified in the flowchart blocks.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts may be separated into multiple blocks and/or the functionality of two or more blocks of the flowcharts and/or block diagrams may be at least partially integrated. Finally, other blocks may be added/inserted between the blocks that are illustrated.

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. As will be obvious to one of skill in the art, methods and devices useful for the present methods can include a large number of optional composition and processing elements and steps.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. In other words, the regions illustrated in the figures are schematic in nature and their shapes are not intended to illustrate the actual shape of a region of a device and are not intended to limit the scope of the invention.

When a group of substituents is disclosed herein, it is understood that all individual members of that group and all subgroups, are disclosed separately. When a Markush group or other grouping is used herein, all individual members of the group and all combinations and subcombinations possible of the group are intended to be individually included in the disclosure.

Every formulation or combination of components described or exemplified herein can be used to practice the invention, unless otherwise stated.

Whenever a range is given in the specification, for example, a temperature range, a size or distance range, a time range, or a composition or concentration range, all intermediate ranges and subranges, as well as all individual values included in the ranges given are intended to be included in the disclosure. It will be understood that any subranges or individual values in a range or subrange that are included in the description herein need not be necessarily included in and/or can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art.

All functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

That which is claimed:

1. An elastomeric stamp, comprising:
a rigid support layer;
a deformable elastomeric layer disposed on the rigid support layer; and
a plurality of posts protruding from the deformable elastomeric layer, wherein each post of the plurality of posts is a respective post having an elastomeric surface configured for contact with a respective transferable component of a plurality of transferable components, wherein the elastomeric surface includes a plurality of three-dimensional relief features protruding therefrom, wherein at least a portion of the relief features and a region of the respective post between the relief features are configured to mechanically deform when the respective post is pressed against the respective transferable component at a first pressure so that the respective post contacts the respective transferable component over a first contact area for reversibly adhering the respective transferable component to the respective post, wherein the respective post is configured to contact the respective transferable component over a second contact area smaller than the first contact area when the respective post is pressed against the transferable component at a second pressure less than the first pressure so as to delaminate the respective transferable component from the region of the respective post, wherein the deformable elastomeric layer, the relief features, and the plurality of posts are formed from the same material, and wherein each of the plurality of relief features has a base area in contact with the elastomeric surface of the respective post that is larger than a distal end area thereof when not subjected to external deformation or force.

2. The stamp of claim 1, wherein one relief feature of the plurality of relief features is spaced apart from another relief feature of the plurality of relief features on the elastomeric surface of the respective post at a distance sufficient such that the region of the respective post therebetween is deformable so as to contact the respective transferable component responsive to application of the first pressure to the stamp.

3. The stamp of claim 2, wherein the first pressure is about 0.39 mN or more.

4. The stamp of claim 1, wherein the first contact area is substantially similar to a cross-sectional area of the respective post taken along a plane parallel to the surface thereof.

5. The stamp of claim 1, wherein relief features of the plurality of relief features are positioned around a periphery of the elastomeric surface of the respective post.

6. The stamp of claim 5, wherein each of the relief features is positioned at a respective corner of the respective post.

7. The stamp of claim 5, wherein the plurality of relief features comprise first relief features, and wherein the elastomeric surface of the respective post further includes a second three-dimensional relief feature that protrudes from the region thereof between the first relief features and is configured to support the respective transferable component.

8. The stamp of claim 7, wherein the second relief feature is larger than the first relief features in at least one dimension.

9. The stamp of claim 5, wherein relief features of the plurality of relief features are symmetrically positioned around the periphery of the elastomeric surface of the respective post.

10. The stamp of claim 9, wherein the relief features of the plurality of relief features that are symmetrically positioned around the periphery of the elastomeric surface of the respective post comprise four relief features.

11. The stamp of claim 5, wherein the plurality of three-dimensional relief features protruding from the elastomeric surface of the respective post consists of four three-dimensional relief features.

12. The stamp of claim 1, wherein a height of each of the plurality of relief features is based on the distance between the ones of the plurality of relief features and an elasticity of the deformable elastomeric layer.

13. The stamp of claim 12, wherein the elastomeric layer, each of the posts and the plurality of relief features comprise polydimethylsiloxane (PDMS).

14. The stamp of claim 13, wherein the height of each of the plurality of relief features is between about 8.5 micrometers and about 13 micrometers.

15. The stamp of claim 1, wherein respective tips of the relief features comprise one or more of pyramidal, conical, and spherical geometries.

16. The stamp of claim 1, wherein the second contact area is substantially similar to a cross-sectional area of the three-dimensional relief features defined by the ends or tips of the relief features.

17. The stamp of claim 1, wherein the same material is polydimethylsiloxane.

18. The stamp of claim 1, wherein the relief features are disposed in a rotationally symmetric arrangement on the elastomeric surface of the respective post.

* * * * *